US010249382B2

(12) United States Patent
Lee et al.

(10) Patent No.: US 10,249,382 B2
(45) Date of Patent: Apr. 2, 2019

(54) DETERMINATION OF FAST TO PROGRAM WORD LINES IN NON-VOLATILE MEMORY

(71) Applicant: SANDISK TECHNOLOGIES LLC, Plano, TX (US)

(72) Inventors: Dana Lee, Saratoga, CA (US); Ekam Singh, San Jose, CA (US); Ashish Ghai, San Jose, CA (US); Kalpana Vakati, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/683,602

(22) Filed: Aug. 22, 2017

(65) Prior Publication Data
US 2019/0066818 A1 Feb. 28, 2019

(51) Int. Cl.
*G11C 11/34* (2006.01)
*G11C 29/44* (2006.01)
*G11C 16/10* (2006.01)
*G11C 16/26* (2006.01)
*G11C 16/34* (2006.01)

(52) U.S. Cl.
CPC ............ *G11C 29/44* (2013.01); *G11C 16/10* (2013.01); *G11C 16/26* (2013.01); *G11C 16/3459* (2013.01)

(58) Field of Classification Search
CPC ......... G11C 29/44; G11C 16/10; G11C 16/26; G11C 16/3459
USPC ............... 365/185.18, 185.19, 185.22, 185.2
See application file for complete search history.

(56) References Cited

U.S. PATENT DOCUMENTS

| 5,321,699 | A | 6/1994 | Endoh et al. |
| 5,386,422 | A | 1/1995 | Endoh et al. |
| 5,448,712 | A * | 9/1995 | Kynett ............. G11C 16/102 365/218 |
| 5,469,444 | A | 11/1995 | Endoh et al. |
| 5,602,789 | A | 2/1997 | Endoh et al. |
| 6,134,140 | A | 10/2000 | Tanaka et al. |
| 6,366,496 | B1 | 4/2002 | Torelli et al. |
| 6,914,823 | B2 | 7/2005 | Chen et al. |
| 6,917,542 | B2 | 7/2005 | Chen et al. |
| 7,023,737 | B1 | 4/2006 | Wan et al. |
| 7,092,290 | B2 | 8/2006 | Hemink |
| 7,215,575 | B2 | 5/2007 | Chen et al. |
| 7,301,817 | B2 | 11/2007 | Li et al. |
| 7,852,683 | B2 | 12/2010 | Lutze et al. |

(Continued)

*Primary Examiner* — Viet Q Nguyen
(74) *Attorney, Agent, or Firm* — Vierra Magen Marcus LLP

(57) ABSTRACT

Techniques are described for determining whether a non-volatile memory device is defective due to a word line that programs too fast, leading to an uncorrectable amount of data errors when programing data to the word line. In one set of examples, a set of memory cells are programmed by a series of voltage pulses applied along a word line without locking out the set of memory cells. A verify operation is then performed to see if the number of memory cells programmed above the verify level is too large and, if so, an error status is returned. In other examples, a lower limit on the number of voltage pulses needed to complete programming is introduced, and if the programming completes in less than this number of voltage pulses, an error status returned. A lower limit on the number of voltage pulses can be on a state by state basis or for all data states to complete.

19 Claims, 19 Drawing Sheets

(56) References Cited

U.S. PATENT DOCUMENTS

| | | | |
|---|---|---|---|
| 7,978,530 B2 | 7/2011 | Lutze et al. | |
| 8,223,556 B2 | 7/2012 | Dutta et al. | |
| 8,305,807 B2 | 11/2012 | Shah et al. | |
| 9,460,799 B1* | 10/2016 | Costa | G11C 16/16 |
| 9,496,040 B2 | 11/2016 | Paudel et al. | |
| 9,548,124 B1* | 1/2017 | Hazeghi | G11C 7/14 |
| 9,548,130 B2* | 1/2017 | Dutta | G11C 16/3459 |
| 9,552,885 B2* | 1/2017 | Shukla | G11C 16/0483 |
| 9,570,160 B1 | 2/2017 | Shah et al. | |
| 9,595,343 B1* | 3/2017 | Srinivasan | G11C 16/3459 |
| 9,620,238 B2* | 4/2017 | Khandelwal | G11C 11/5628 |
| 9,710,325 B2* | 7/2017 | Chen | G11C 11/5628 |
| 9,711,227 B1* | 7/2017 | Ghai | G06F 3/0619 |
| 9,852,065 B1* | 12/2017 | Rajwade | G06F 12/0246 |
| 10,032,511 B1* | 7/2018 | Hung | G11C 13/0069 |
| 2005/0024939 A1 | 2/2005 | Chen et al. | |
| 2005/0024943 A1 | 2/2005 | Chen et al. | |
| 2005/0207222 A1 | 9/2005 | Chen et al. | |
| 2006/0104120 A1* | 5/2006 | Hemink | G11C 11/5628 365/185.28 |
| 2006/0120165 A1* | 6/2006 | Hemink | G11C 11/5628 365/185.28 |
| 2007/0266276 A1* | 11/2007 | Gatzemeier | G11C 29/34 714/718 |
| 2008/0062770 A1 | 3/2008 | Tu et al. | |
| 2008/0205137 A1* | 8/2008 | Yanagidaira | G11C 11/5628 365/185.03 |
| 2009/0238006 A1* | 9/2009 | Nobunaga | G11C 16/10 365/185.19 |
| 2010/0002514 A1 | 1/2010 | Lutze et al. | |
| 2010/0329004 A1* | 12/2010 | Hemink | G11C 11/5628 365/185.03 |
| 2011/0007569 A1 | 1/2011 | Lutze et al. | |
| 2011/0228609 A1 | 9/2011 | Lutze et al. | |
| 2012/0327710 A1* | 12/2012 | He | G11C 16/10 365/185.2 |
| 2013/0028021 A1* | 1/2013 | Sharon | G11C 11/5642 365/185.17 |
| 2014/0247666 A1* | 9/2014 | Dutta | G11C 16/14 365/185.19 |
| 2014/0254285 A1* | 9/2014 | Eguchi | G11C 7/04 365/185.29 |
| 2017/0091015 A1* | 3/2017 | Yadav | G06F 11/0793 |
| 2017/0125117 A1 | 5/2017 | Tseng et al. | |
| 2018/0157546 A1* | 6/2018 | Yoo | G06F 11/079 |

* cited by examiner

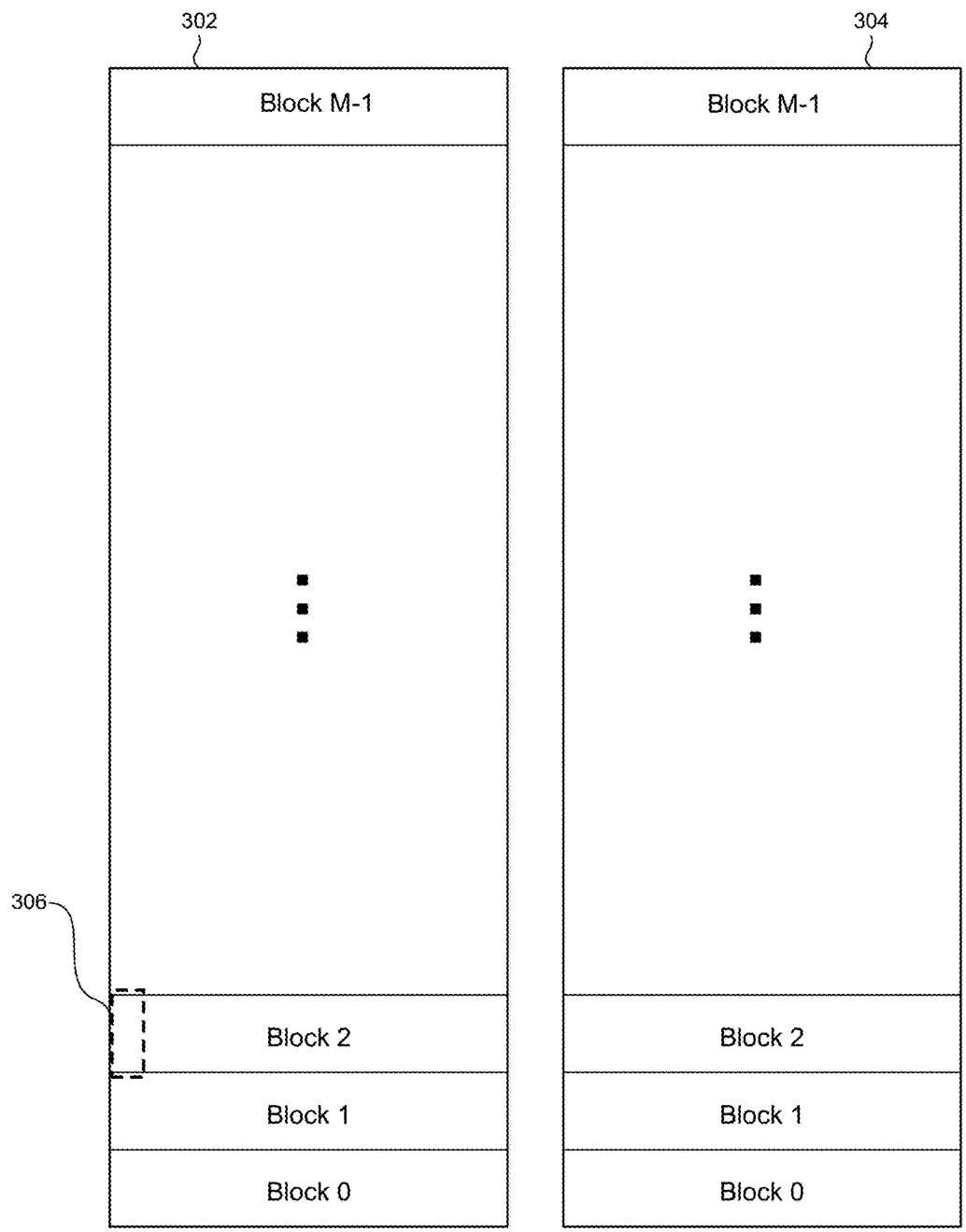

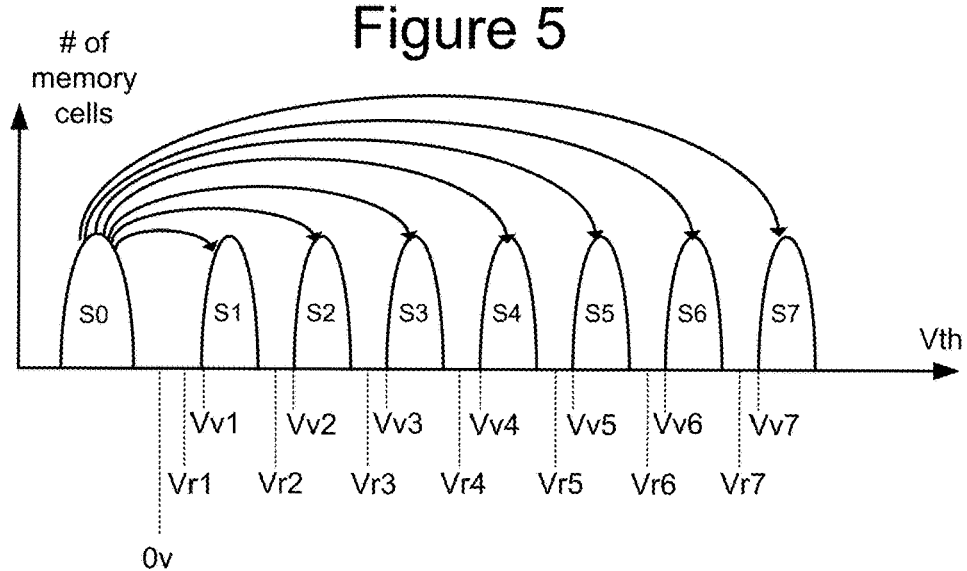
Figure 5
Figure 6
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
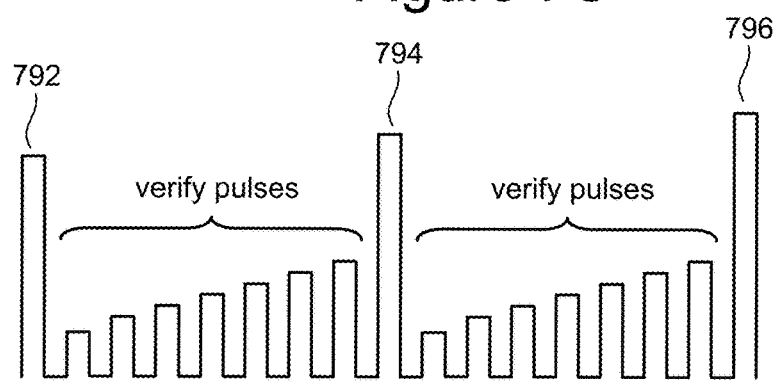
Figure 7C

DETERMINATION OF FAST TO PROGRAM WORD LINES IN NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

As memory structures increase in density, it becomes more challenging to maintain the integrity of the data being stored.

BRIEF DESCRIPTION OF THE DRAWINGS

Like-numbered elements refer to common components in the different figures.

FIG. 4A is a block diagram of a memory structure having two planes.

FIG. 5 depicts threshold voltage distributions.

FIG. 6 is a table describing one example of an assignment of data values to data states.

FIG. 7C depicts a word line voltage during programming and verify operations.

DETAILED DESCRIPTION

Figure 1:
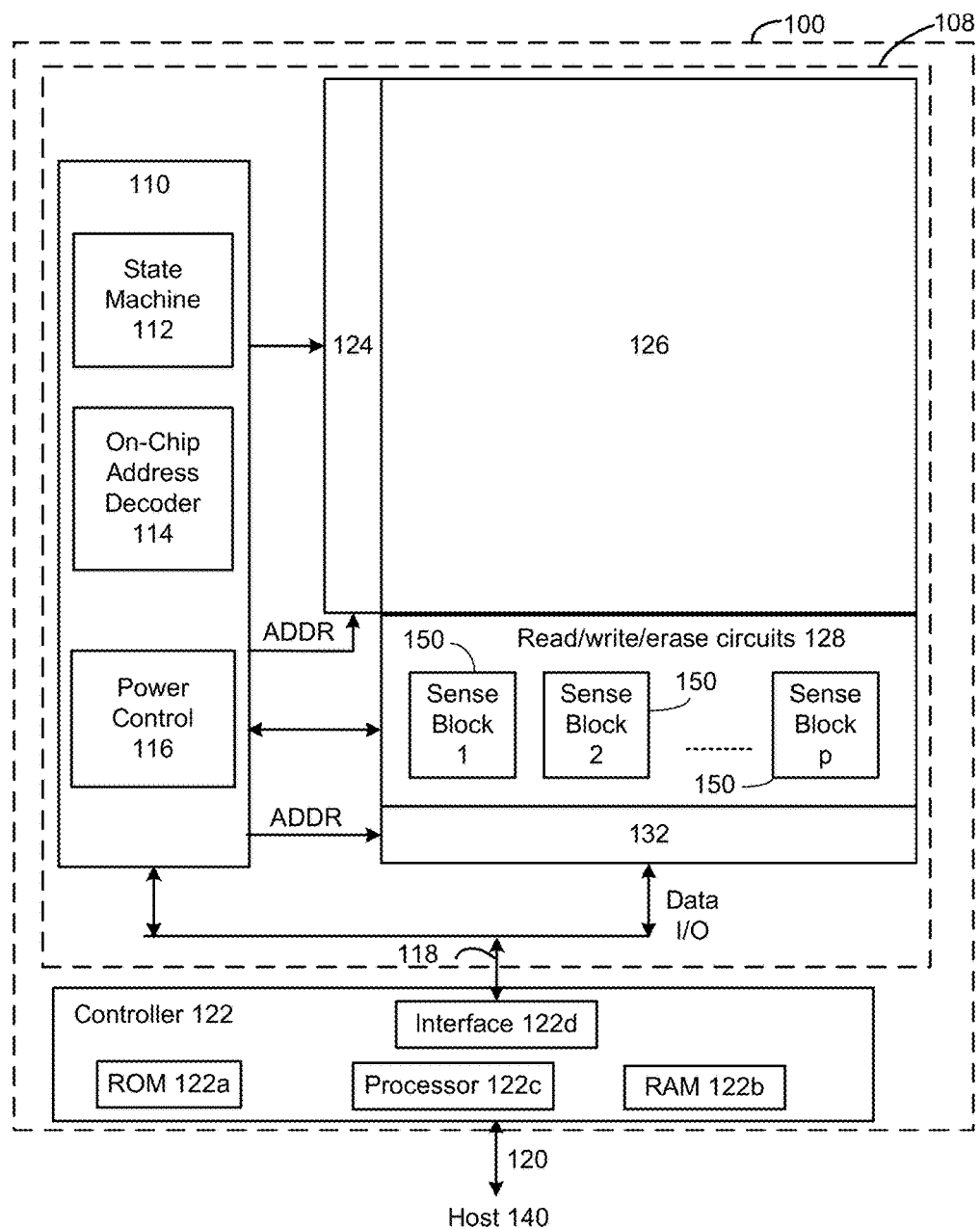
FIG. 1 is a functional block diagram of a memory device.

Performance, including programming speed, is an important standard of measurement for non-volatile memory devices. Non-volatile memory devices are typically programmed by applying to the memory cells a series of voltage pulses that progressively increase in amplitude in a staircase-like waveform. To improve programming performance, the memory device can, for example, use device parameters that use a higher starting voltage level for the first voltage pulse, use larger step sizes for the pulse-to-pulse increase, or some combination of these and other techniques. However, if these parameters are pushed too much for speed, this can eventually lead to over programming of memory cells, resulting in an amount of error that exceeds the error correction capabilities of the memory system.

Although such over programming can occur in many non-volatile memory systems, some designs tend to be more prone to this problem. For example, in non-volatile memories having a three-dimensional NAND structure, the memory cells are formed along word lines in multiple layers extending down along "memory holes." Due to the process for forming such memories, these memory holes tend to taper, becoming narrower as the hole goes deeper into the structure. This can result in the word lines along different layers programming at different speeds, so that optimizing the programming parameters to have constant programming times across all the layers can be very tricky. As a result, some word lines program overly fast, resulting in an uncorrectable amount of over-programming. Consequently, it would be useful to for the memory system to be able to determine such fast to program word lines to help weed out a potential bad die or bad block during testing and during subsequent device operation.

The following presents several techniques for determining word lines that program too fast. In one set of techniques, memory cells along a word line are programmed by applying a number voltage pulses along the word line without the memory cells being inhibited or locked out. After the number of voltage pulses are applied, a verify operation is performed to determine how many of the memory cells have threshold voltages above some reference level; and, if the number of cells with threshold voltages above the reference level is too high, an alert of an error status is returned. This process can be done either as part of a test process, either during the initial testing of the device or later as part of a Built-In Self-Test (BIST) operation where the test circuitry is part of the on-chip control circuitry, or as part of an algorithm for programing data. In the case of a data program operation, the reference level can be a standard verify level for a data state in a multi-state program operation.

In another set to techniques, the number of voltage pulses needed for a word line to complete programming can be used to determine whether it is too low. This can be done either as a test process, during the initial testing of the device or later as part of BIST operation, or as part of an algorithm for programing data. As part of the algorithm for programing data, the number voltage pulses to complete the programming of all states can be checked, or, in the case of a multi-state programming operation, the number of voltage pulses need to complete programing one or more of the individual data states can be considered. The determination of a lower limit for the number of voltage pulses can be a set value or vary. For example, as memory devices often become faster to program as they age, the lower limit can be a function of the number of program/erase cycles the device has experienced. In another example, in a multi-state programing operation using a smart verify algorithm, an alert or error status can be returned if a particular state completes programming with some number of voltage pulse after that state is first begun to be verified.

FIGS. 1-4G describe one set of examples of a memory system that can be used to implement the technology proposed herein. FIG. 1 is a functional block diagram of an example memory device. The components depicted in FIG. 1 are electrical circuits. Memory device 100 includes one or more memory die 108. Each memory die 108 includes a three-dimensional memory structure 126 of memory cells (such as, for example, a 3D array of memory cells), control circuitry 110, and read/write/erase circuits 128. In other embodiments, a two-dimensional array of memory cells can be used. Memory structure 126 is addressable by-word lines via a row decoder 124 and by bit lines via a column decoder 132. The read/write/erase circuits 128 include multiple sense blocks 150 including Sense Block 1, Sense Block 2, . . . , Sense Block p (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write/erase circuits 128 to perform memory operations (e.g., erase, program, read, and others) on memory structure 126, and includes a state machine 112, an on-chip address decoder 114, and a power control module 116. The state machine 112 provides die-level control of memory operations, such as programming different memory cells to different final targets for a common data state based on distance to an edge of a word line layer. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write/erase circuits 128, and/or controller 122 can be considered a control circuit that performs the functions described herein.

The (on-chip or off-chip) controller 122 (which in one embodiment is an electrical circuit) may comprise one or more processors 122c, ROM 122a, RAM 122b, and Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below related to programming. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. The controller can maintain various operating parameters in RAM 122b. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) of memory holes, with each column having multiple memory cells. The memory holes may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
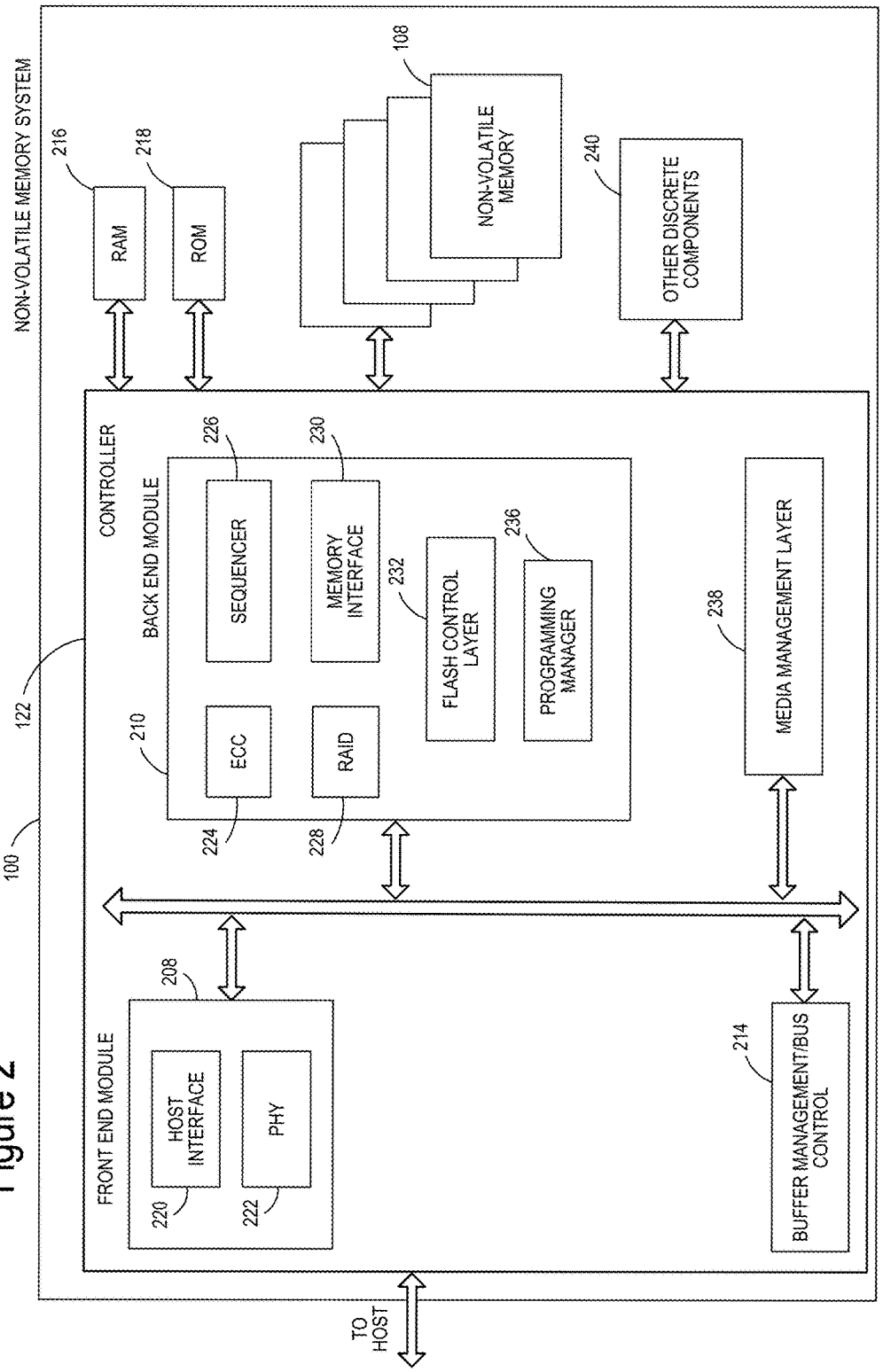
FIG. 2 is a block diagram depicting one embodiment of a memory system.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing programs to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 112 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells. The programming manager 236 can also manage the data relocation operations or other remedial actions when a word line is found defective due to programming too fast, as discussed further below. Programming manager 236 can be an electrical circuit, a set of one or more software modules, or a combination of a circuit and software.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into programs to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into programs into the flash memory 126. As described below, erratic bits may be identified and recorded using the MML 238. This recording of erratic bits can be used for evaluating the health of blocks and/or word lines (the word line unit of the memory cells on the word lines).

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Figure 3:
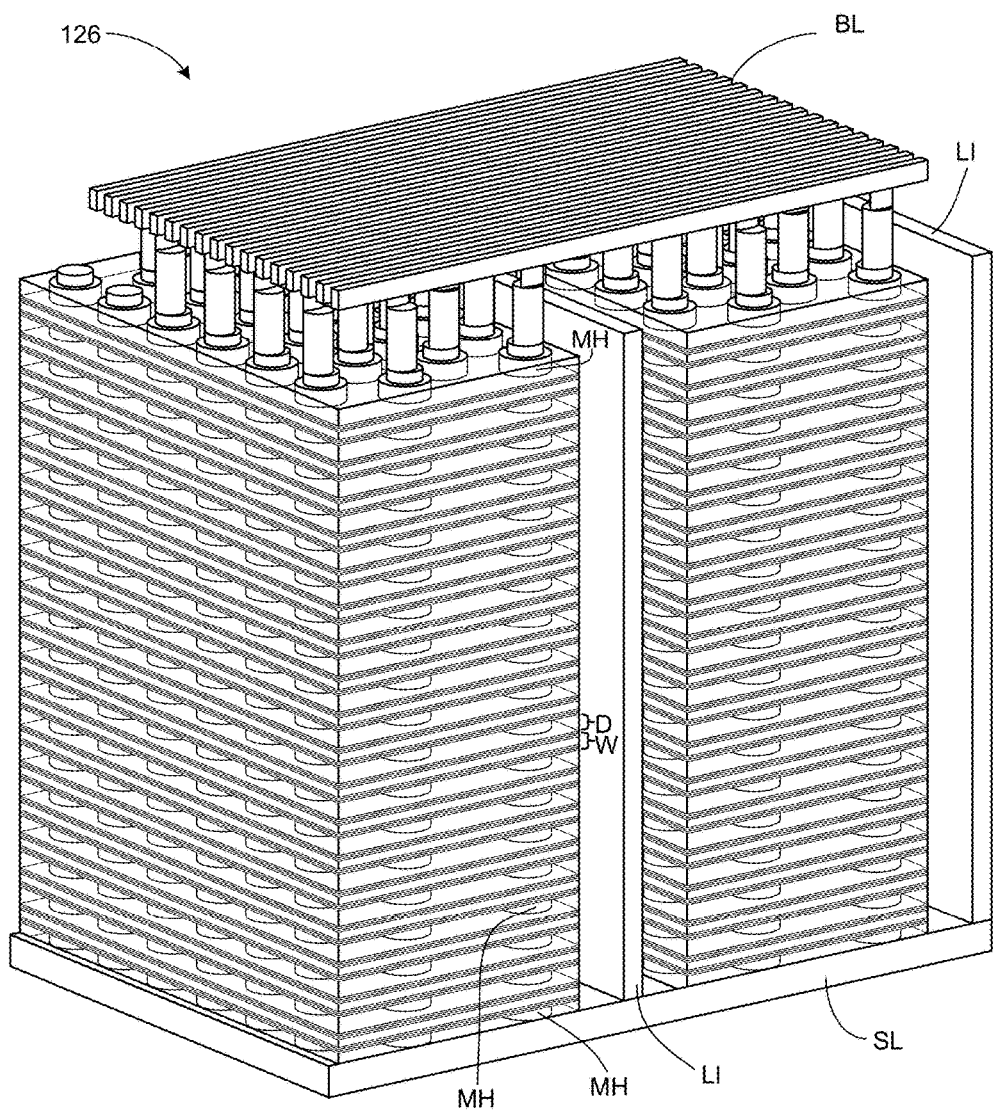
FIG. 3 is a perspective view of a portion of one embodiment of a monolithic three-dimensional memory structure.

FIG. 3 is a perspective view of a portion of one example embodiment of a monolithic three-dimensional memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided below with respect to FIG. 4A-4G.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
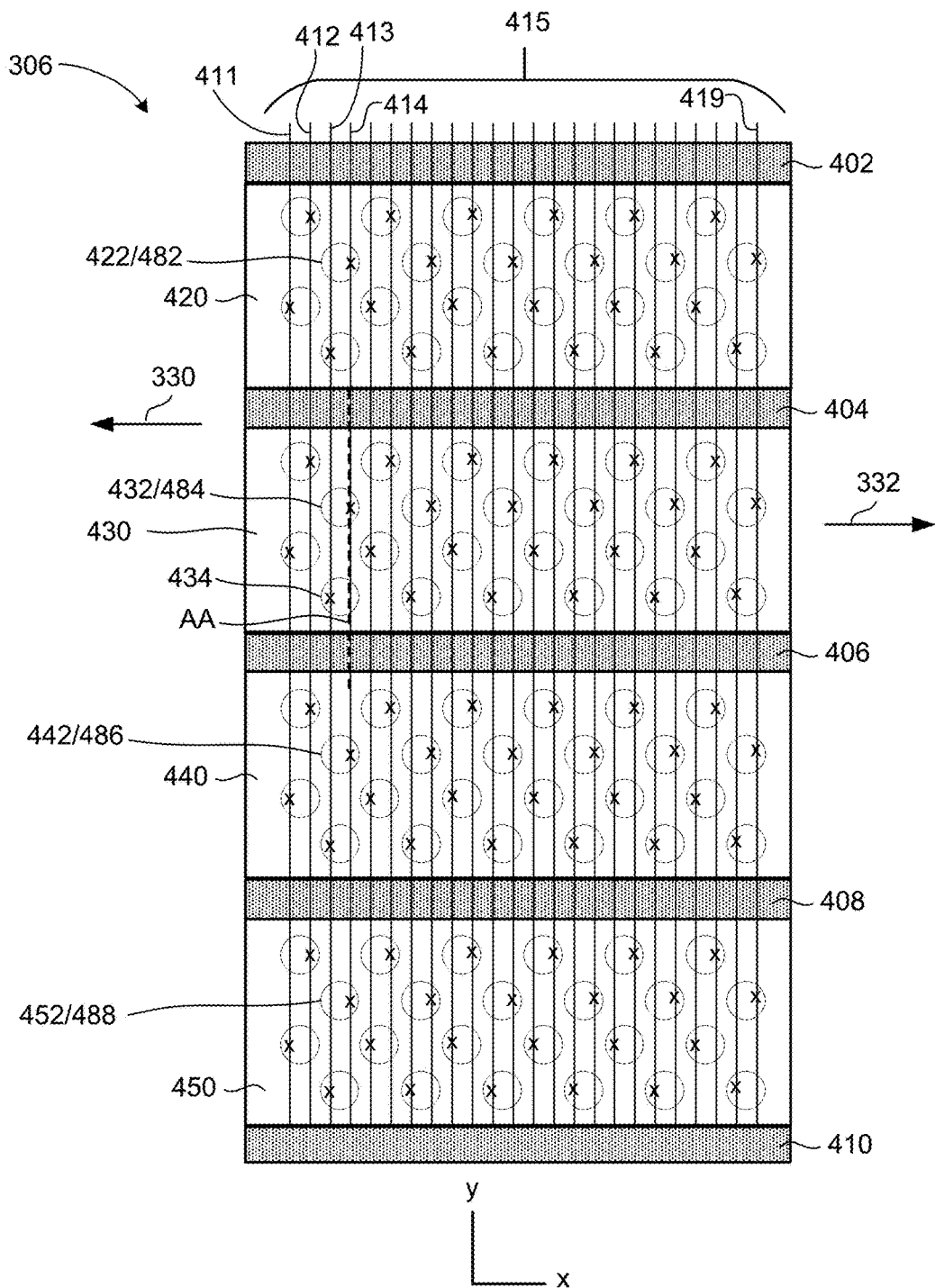
FIG. 4B depicts a top view of a portion of a block of memory cells.

FIGS. 4B-4G depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the memory holes. Each of the vertical columns of the memory holes include multiple select transistors and multiple memory cells. In one embodiment, each memory hole implements a NAND string and, therefore, can be referred to as a memory column or memory hole. A memory column can implement other types of memory in addition to NAND. FIG. 4B depicts memory holes 422, 432, 442 and 452. Memory hole 422 implements NAND string 482. Memory hole 432 implements NAND string 484. Memory hole 442 implements NAND string 486. Memory hole 452 implements NAND string 488. More details of the vertical columns of memory holes are provided below. Since the block depicted in FIG. 4B extends in the direction of arrow 330 and in the direction of arrow 332, the block includes more memory holes than depicted in FIG. 4B FIG. 4B also depicts a set of bit lines 415, including bit lines 411, 412, 413, 414, . . . 419. FIG. 4B shows twenty-four-bit lines because only a portion of the block is depicted. It is contemplated that more than twenty-four-bit lines connected to memory holes of the block. Each of the circles representing memory holes has an "x" to indicate its connection to one bit line. For example, bit line 414 is connected to memory holes 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one memory hole in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns of the memory holes. In one embodiment, isolation areas 402, 404, 406, 408 and 410 are filled with a layer of SiO$_2$ (blocking) and a layer of polysilicon (source line connection).

Although FIG. 4B shows each region having four rows of memory holes, four regions and sixteen rows of memory holes in a block, those exact numbers are an example implementation. Other embodiments may include more or less regions per block, more or less rows of memory holes per region and more or less rows of memory holes per block.

FIG. 4B also shows the memory holes being staggered. In other embodiments, different patterns of staggering can be used. In some embodiments, the memory holes are not staggered.

Figure 4C:
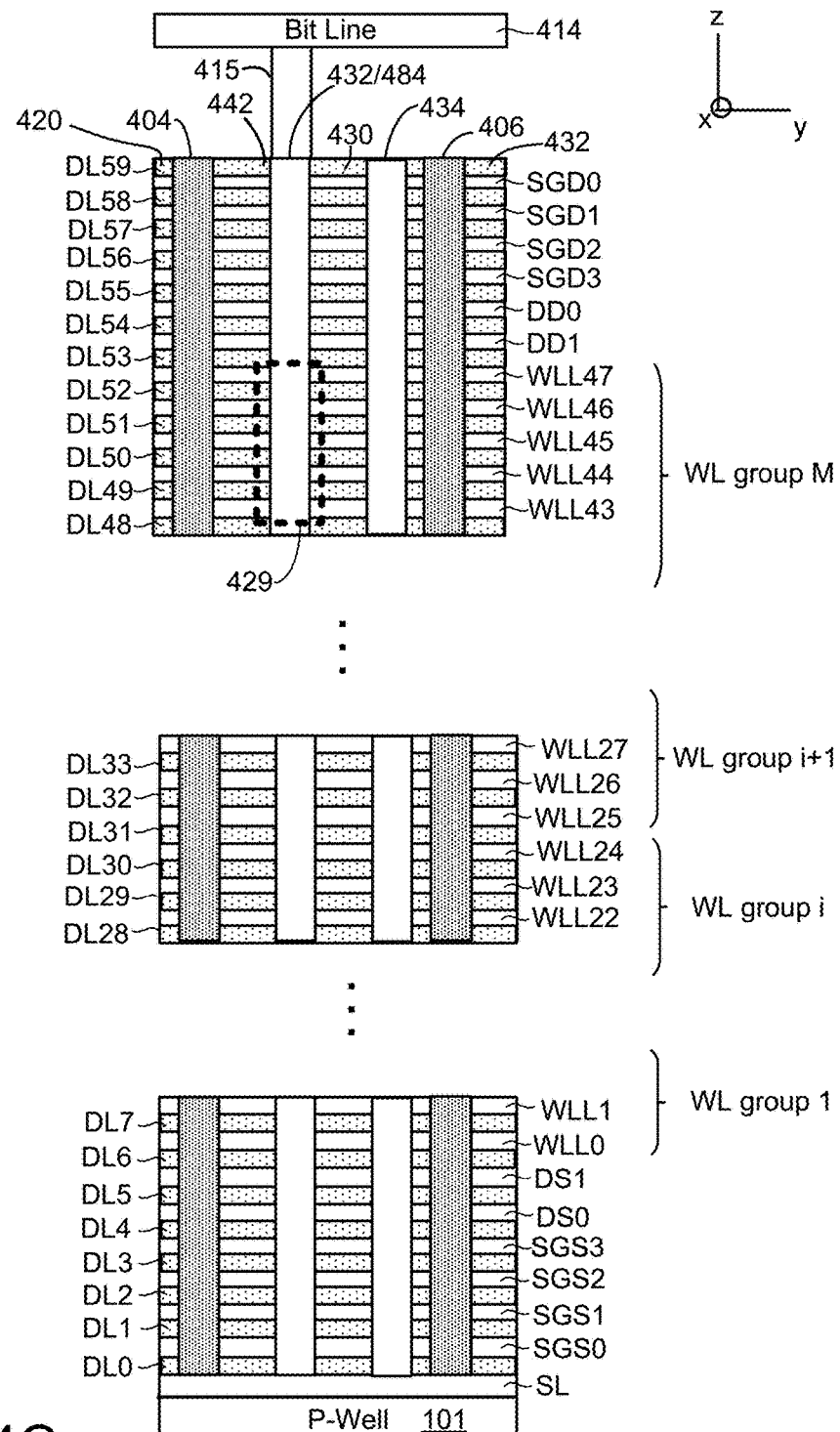
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through memory holes 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells as word line units of the memory cells connected to the word lines. Other embodiments can implement more or less than four drain side select layers, more or less than four source side select layers, more or less than four dummy word line layers, and more or less than forty-eight word line layers (e.g., 96 word line layers). Memory holes 432 and 434 are depicted protruding through the drain side select layers, source side select layers, dummy word line layers and word line layers. In one embodiment, each memory hole comprises a NAND string. For example, memory hole 432 comprises NAND string 484. The NAND string of memory hole 432 has a source end at a bottom of the stack and a drain end at a top of the stack. As in agreement with FIG. 4B, FIG. 4C show memory hole 432 connected to Bit Line 414 via connector 415. Isolation areas 404 and 406 are also depicted. Below the memory holes and the layers listed below, and over the underlying substrate, is source line SL and well region P-Well 101. A block of memory cells will share a common well region and in an erase operation, the erase voltage Verase is applied to the P-Well 101 and, through the source line SL, to channel region of the memory holes.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL51 is above word line layer WLL45 and below word line layer WLL46. In one embodiment, the dielectric layers are made from SiO$_2$. In other embodiments, other dielectric materials can be used to form the dielectric layers.

The non-volatile memory cells are formed along memory holes which extend through alternating conductive and dielectric layers in the stack. In one embodiment, the memory cells are arranged in NAND strings. The word line layer WLL0-WLL47 connect to memory cells (also called data memory cells) to form word line units. Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
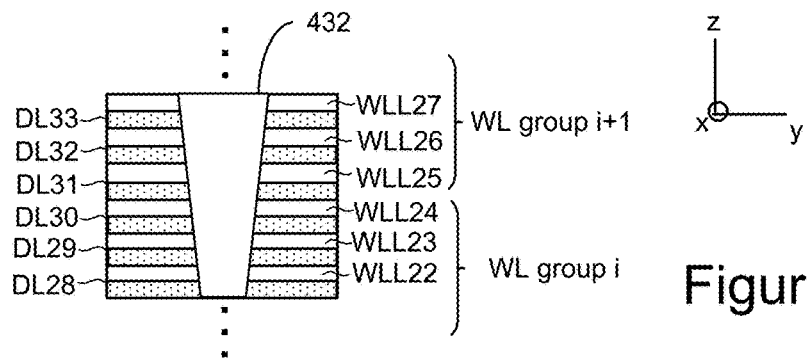
FIG. 4D is a detailed view of a portion of FIG. 4C illustrating the tapering of the memory holes.

Although the FIG. 4C shows the regions 432 and 434 as being cylindrical, extending upwards in the z-direction with parallel sides, in an actual device the process of forming memory holes typically results in the memory holes tapering as they go deeper into the structure. FIG. 4D is a detail of FIG. 4C illustrating the tapering of the memory holes, but in an exaggerated form for purposes of discussion.

As shown in FIG. 4D, the column 432 narrows as it descends, being wider where it passes through word line layer WLL27 than where it passes through word line WLL22. Although this tapering is exaggerated in FIG. 4D, when looking at the entire stack of FIG. 4C the difference in memory hole diameter can vary significantly between the bottom of the stack and the top. This physical difference in structure on the different word line layers can lead to them acting differently. For example, due to the tapering of the memory holes, lower word lines tend to program faster than higher word lines that have a larger memory hole diameter. To account for these sorts of variations, the word lines can be split into word line groups and treated differently. FIG. 4C shows the word lines split up into M word line groups, where the number of such groups is a design decision based on balancing the complexity of more word line groups against the accuracy of accounting for variations in memory hole dimension.

Applying the grouping of word lines to compensate for the dimensional variation of the memory holes to the case of programming, parameters can be used to enable the system to define which word line groups could use an additional program voltage offsets on top of the default programming voltage. These parameters can specify higher starting voltages, bigger step sizes and/or other variations in the programming waveform in order to meet performance requirements.

Figure 4G:
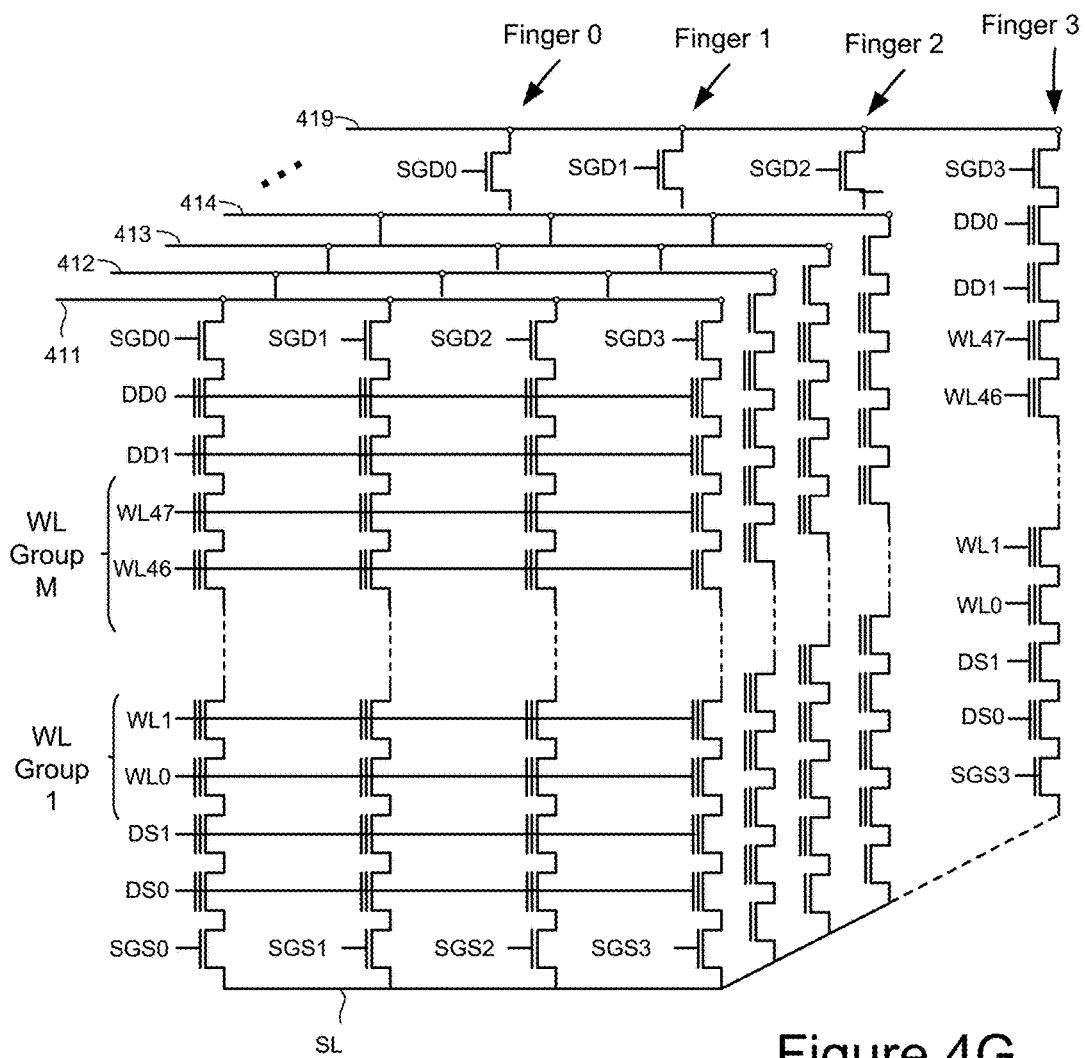
FIG. 4G is a schematic of a plurality of NAND strings.
Figure 4E:
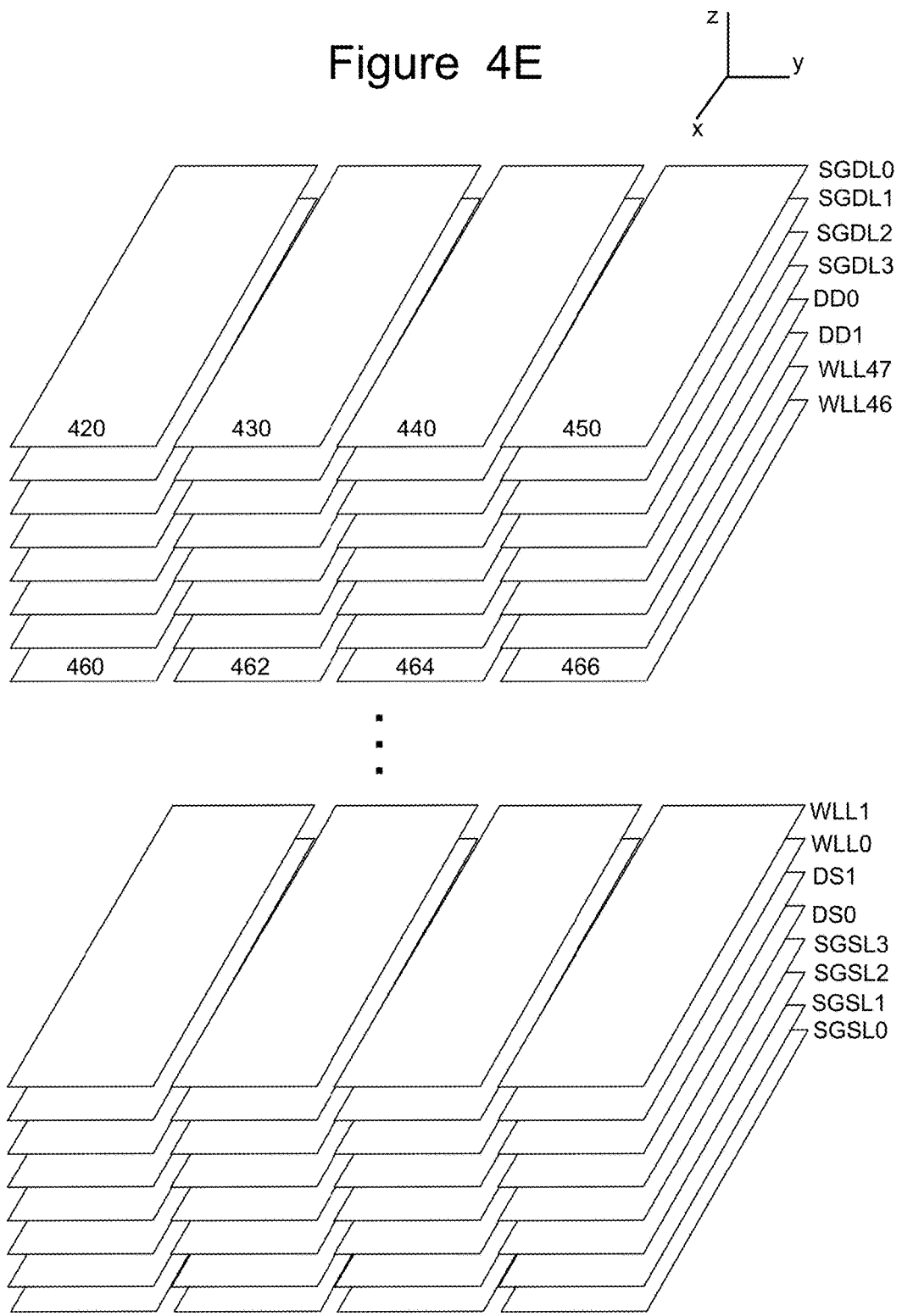
FIG. 4E depicts a view of the select gate layers and word line layers.

FIG. 4E depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4F:
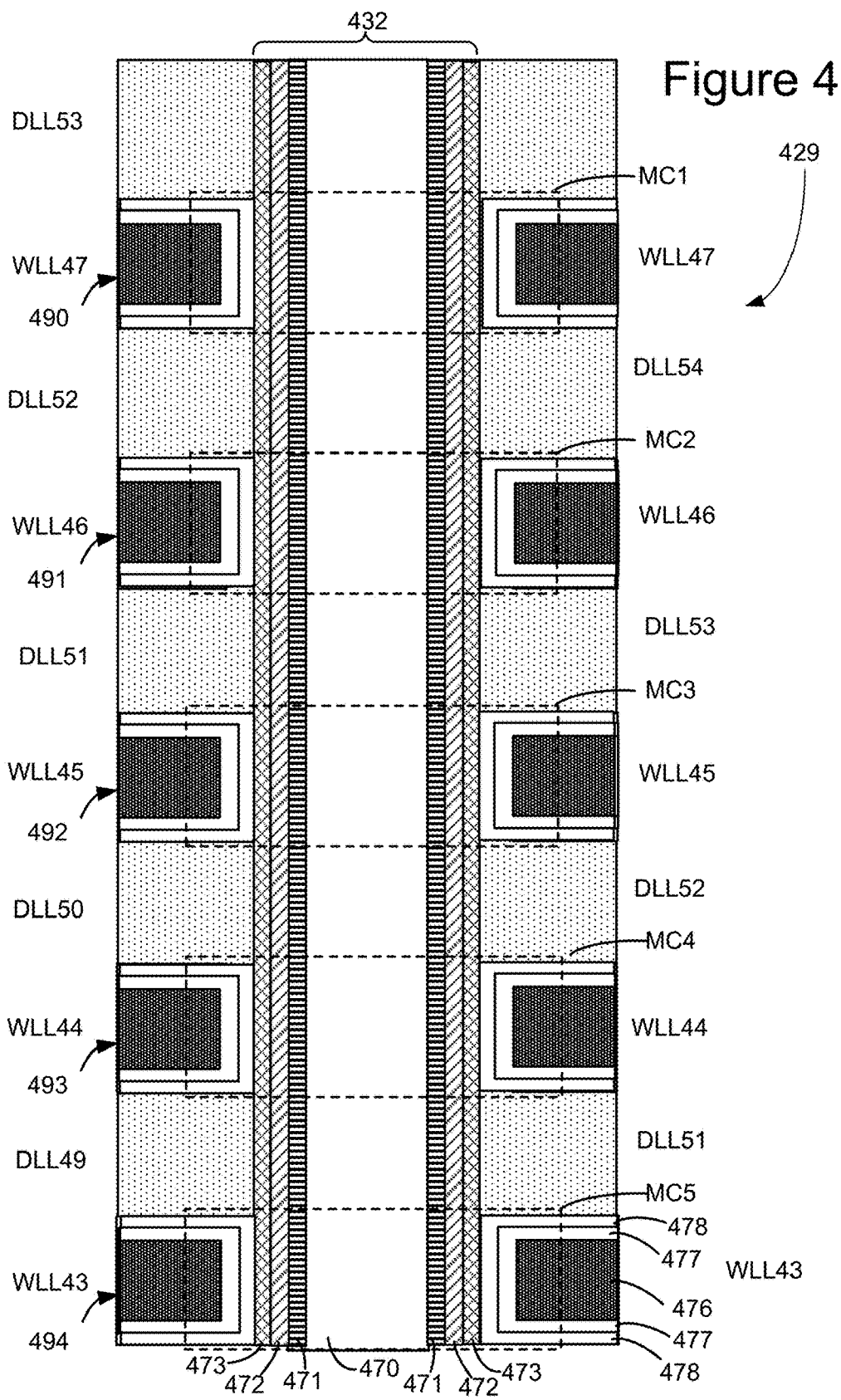
FIG. 4F is a cross sectional view of a vertical column of memory cells.

FIG. 4F depicts a cross sectional view of region 429 of FIG. 4C that includes a portion of vertical column of the memory hole 432. In one embodiment, the vertical columns of the memory holes are round and include four layers; however, in other embodiments more or less than four layers can be included and other shapes can be used. In one embodiment, vertical column of the memory hole 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4F depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of memory hole 432 comprise a memory cell MC1. Word line layer WLL46 and a portion of memory hole 432 comprise a memory cell MC2. Word line layer WLL45 and a portion of memory hole 432 comprise a memory cell MC3. Word line layer WLL44 and a portion of memory hole 432 comprise a memory cell MC4. Word line layer WLL43 and a portion of memory hole 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

FIG. 4G is a circuit diagram of a plurality of NAND strings according to the embodiments of FIGS. 3-4F. FIG. 4G shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four fingers finger 0, finger 1, finger 2 and finger 3. Finger 0 corresponds to those vertical NAND strings controlled by SGD0 and SGS0, finger 1 corresponds to those vertical NAND strings controlled by SGD1 and SGS1, finger 2 corresponds to those vertical NAND strings controlled by SGD2 and SGS2, and finger 3 corresponds to those vertical NAND strings controlled by SGD3 and SGS3. The example of FIG. 4G again shows the separation of word lines into groups Although the example memory system of FIGS. 4A-4G is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells are erased (e.g., in data state S0).

Figure 7A:
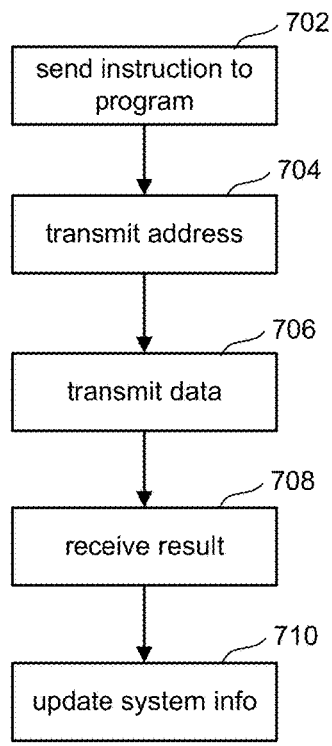
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
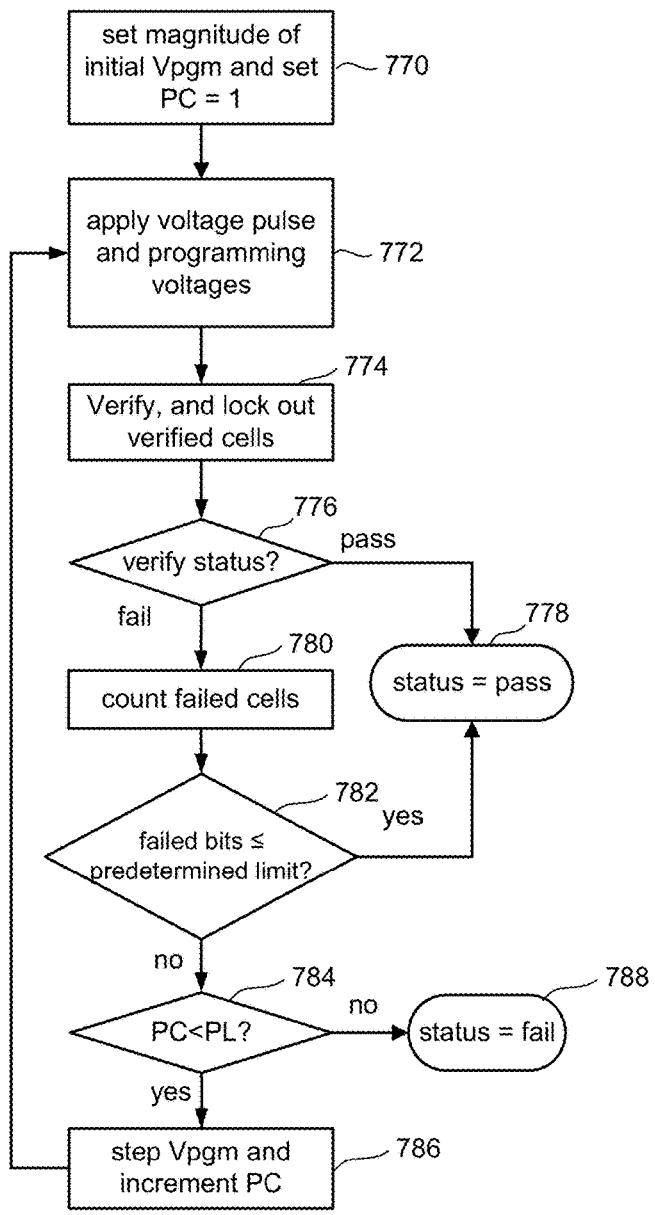
FIG. 7B is a flow chart describing one embodiment of a process for programming data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected common word line) during a program operation is applied as a series of program voltage pulses. Between program voltage pulses are a set of verify voltage pulses to perform verification. In many implementations, the magnitude of the program voltage pulses is increased with each successive voltage pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a voltage pulse of the program signal Vpgm is applied to the selected word line (the word line selected for programming). In one embodiment, the group of memory cells being programmed concurrently are all connected to the same common word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program voltage pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next voltage pulse will have a magnitude greater than the previous voltage pulse by a step size (e.g., a step size of 0.1-0.5 volts). After step 786, the process loops back to step 772 and another voltage pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages $Vr1, Vr2, Vr3, Vr4, Vr5, Vr6,$ and $Vr7,$ of FIG. 5) or verify operation (e.g. see verify reference voltages $Vv1, Vv2, Vv3, Vv4, Vv5, Vv6,$ and $Vv7$ of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

FIG. 7C shows a verify pulse for each of the non-erased states S1-S7 between each of the program voltage pulses 792, 794 and 796. These verify pulses consume a significant portion of a program operation. As the number of states stored per memory cell increases, this situation becomes worse, limiting programming speed. FIG. 7C corresponds to 3-bit per cell and uses 7 verify levels. In a 4-bit per cell embodiment, a verify of all non-erased states would need 15 verify operations between program voltage pulses. To improve performance, some of these verify levels can be skipped at various points of the programming operation through use of an "intelligent" or "smart" verify algorithm. As higher states take longer to program, initially only the lowers states are verified, with the high states being added progressively as the program operation proceeds. Similarly, after some number of voltage pulses, the lower states can progressively be dropped as cells being written to the level will either have completed programming or considered defective.

Figure 7D:
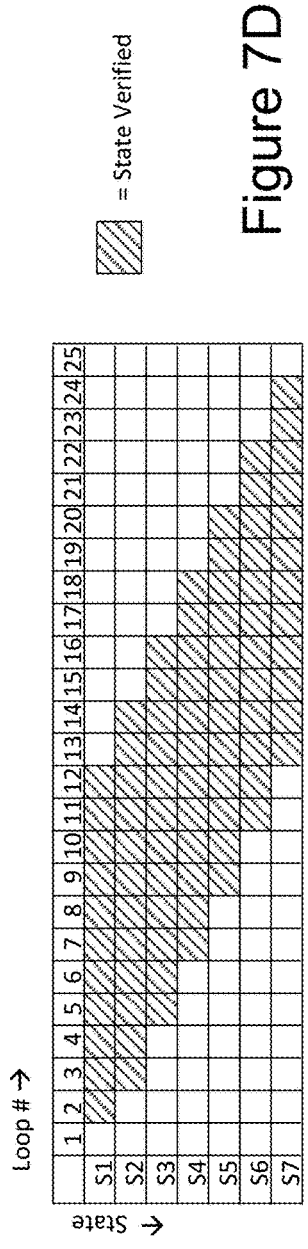
FIG. 7D illustrates the use of a smart verify algorithm.

FIG. 7D illustrates one embodiment for a smart verify algorithm for a 3-bit per cell embodiment, illustrating which data states would be verified after a given voltage pulse. More specifically, FIG. 7D plots the target state to which a cell is being programmed against the program loop number, or number of voltage pulses that have been applied, in a smart verify algorithm. The shaded squares correspond to the states verified after the voltage pulse of each loop, where the smart verify arrangement checks only those states likely to still be programming for non-defective cells. For example, after the 13th voltage pulse, the lowest state S1 has be dropped, while states S2-S7 are being verified, with this being the initial verify at the level corresponding to the state S7. In this embodiment, this reduces the number of inter-pulse verifies to no more than six, rather the full 15 that would be needed if all states were verified. When to add and drop states can be determined in a number of ways. For example, these could be parameters determined and set based on device characterization tests. In some embodiments, these parameters could depend on factors such as the number of program/erase cycles to take into account device aging, as memory cells often program faster as they are cycled. Alternately, or additionally, states can be added or dropped based on the results of earlier verify operations. For example, if at the initial verify for, say, the state S4 more or less than the expected number of cells verify, verifies for S5 and other higher states can be introduced sooner or later; and if a given all memory cells being written to a given data state are found to have completed programming, subsequent verifies for that state can be dropped.

Due to the physical structure difference in word lines from the tapering of memory holes (see FIG. 4D), lower word lines tend to be faster to program as compared to upper word lines, which have larger memory hole critical dimensions. To compensate for this variation, the word lines can be split into groups, as illustrated in FIGS. 4C and 4G. These figures show the word lines split up into M word line groups, where the number of such groups is a design decision based on balancing the complexity of more word line groups against the accuracy of accounting for variations in memory hole dimension. Within a group, the variations due to the physicality of the memory holes are generally small enough that a common set of operating parameters can be used. The availability of different parameters for different word line groups enables the memory device to define different programming parameters for each of the word line groups. For example, slower to program word line groups can start the programming voltage staircase waveform at a higher value, starting the programming voltage (Vpgm) at a raised voltage level that is offset above a default value by some amount. However, even when being able to tune the programming parameters of each word line group individually, due to programing speed variation with a word line group, due to improper tuning the groups programming parameters, or both, a word line may still program too rapidly.

In order to meet performance requirements, device parameters for the word line groups would use higher starting voltages, bigger step size, or some combination of these and other programming chance to program upper word line groups with the same number of voltage pulses as lower word line groups. In these scenarios, there could be situations when the Vpgm waveform used for specific word lines groups or individual word lines within a group may not be optimum and consequently could take a lower number of loops to program the data. If a word lines is particularly fast to program, this could cause over programming for the memory cells along this word line, where the threshold voltage distribution of the memory cells along the word line more than desired by the voltage pulses of the programing waveform, and result in an uncorrectable ECC (UECC) result where the number of erroneously programmed memory cells for the word lines is more than the ECC algorithm can handle.

Figure 8:
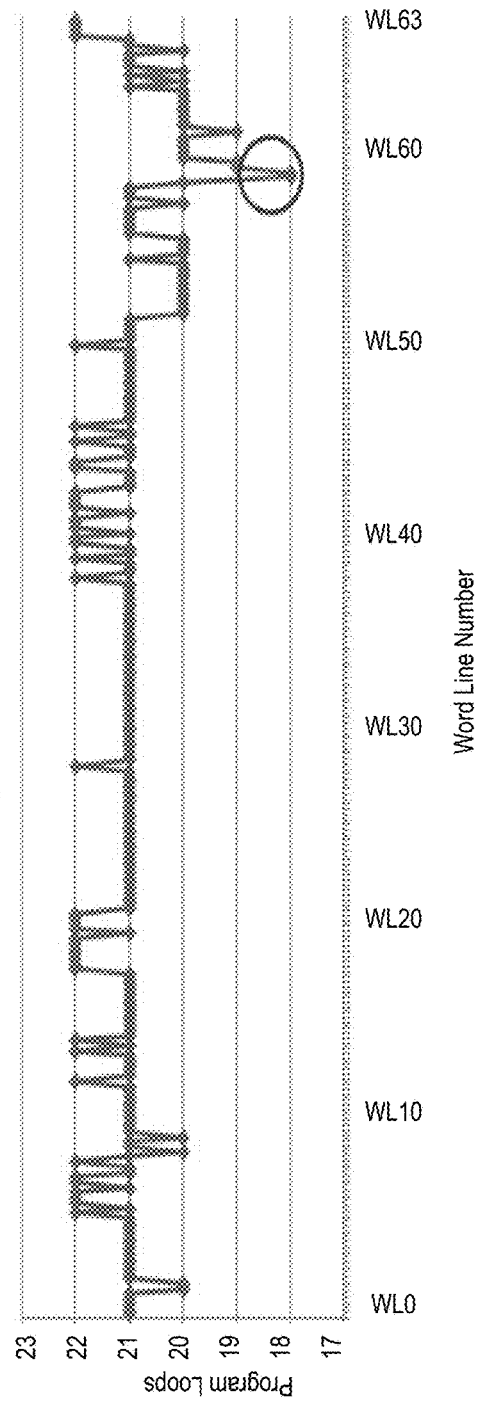
FIG. 8 shows an example of the variation in the number of program loops to complete programming for different word lines.

Even without the issue of memory hole tapering in the 3D NAND memory structure, an overly fast word line could arise due to process variations or other factors for other memory architectures. However, the processing for the physical structure of a 3D can make the word line to word line variations in programming speeds more pronounced. As the lowest word lines are often fastest to program and with lesser amounts of variation in programming speed, the word lines of a lower word line group tend be behave more uniformly. The higher the word line group, the larger the offset in the initial program voltage pulse and step size that is likely to be used, so that the top-most word line group will often be the most prone to this problem of an overly fast word line, particularly the lowest word line of the top-most group. Memory cells connected to this word line are at a higher risk of being over programmed (e.g., their threshold voltage is raised too high) such that an error occurs when reading the word line. FIG. 8 illustrates the occurrence of an overly fast to program word line.

FIG. 8 shows an example of the variation in the number of program loops (i.e., number of voltage pulses) to complete programming versus word line number for an embodiment where word line WL0 is the lowest in the 3D structure and WL 63 the top-most word line of the structure. The word lines typically take about 21 program loops, give or take a voltage pulse, to complete programing. However, the top-most group of word lines, that receive more intensive programming, show more variation, with some word lines finishing in 19 voltage pulses or, as circled for around WL58, in 18 voltage pulses. Such a fast programming word line can lead to an uncorrectable amount of error, with a failed bit count exceeding the ECC capabilities of the system. The traditional concern for non-volatile memory has been with defective word lines that are too slow to program, such as would be picked up at step 784 of FIG. 7B; however, as just described, a word line that is too fast to program also needs to be considered as a possible defect.

The following presents several different and complementary embodiments for the determination that a word line is fast to program. A first set of embodiments includes applying a number of voltage pulses along a word line without verifying, or at least with not locking out from further programming, memory cells connected along the word line. A verify is then performed to see how many of the memory cells are programmed above a reference level. A second set of embodiments looks at the number of voltage pulses required to complete a program operation and determining whether this value is too low. For either set of embodiments, the test can be incorporated into a programming operation to write data values into the memory cells of the word line, or as part of a test operation performed specifically for the purpose, either as part of the set of tests performed on a new device before shipping or once the device in the field where it can be performed as part of a Built-In Self-Test routine executed by the on-chip controller.

Figure 9A:
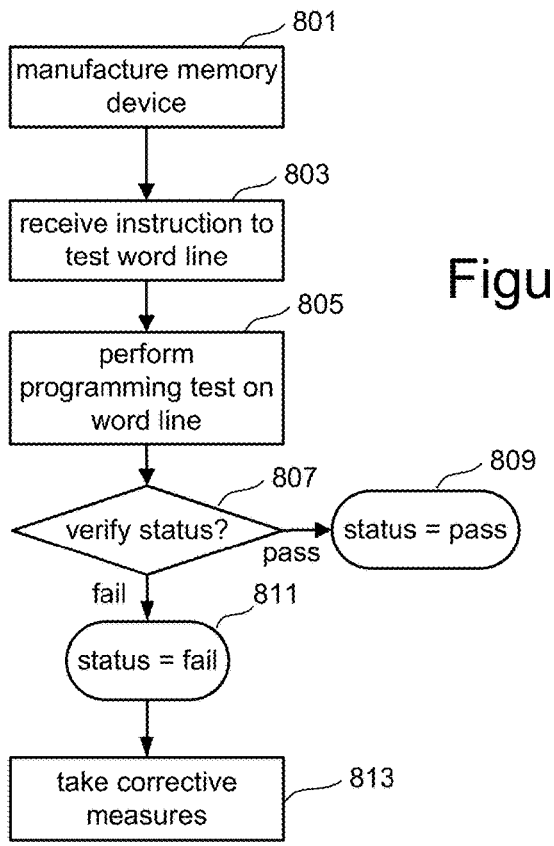
FIG. 9A is a flowchart describing one embodiment of a process for testing a word line to determine whether it is programming too fast.

FIG. 9A is a flowchart describing one embodiment of a test process for determining a fast to program word line. At step 801, the memory device is manufactured, with an instruction to test the word line being received at 803. The test can be part of the set of initial tests processes performed on a new device before being shipped out. The test can also be performed after the device is in use in the filed as part of Built-In Self-Test (BIST) operation under the control of the on-chip controller 110. At step 805 the test is performed on the word line.

As described further below, in one set of embodiments the test can be based on applying a series of voltage pulses to the word line, after which the memory cells are verified to determine the number that have a threshold voltage above a test verify value. At step 807, the status is verified by determining whether the number that have a threshold voltage above a test verify value is above a limit: if above the limit, a fail status is returned at step 811; and the number is below the limit, a pass status is returned at step 809.

In another set of embodiments also described further below, at step 807 the status is verified by determining the number of voltage pulses used to complete the programming of the memory cells to a data state. If the number of pulses is at or above a limit value, a status of pass is returned at step 809. If the number pulses is below the limit value, a fail status is returned at step 811.

For either of the sets of embodiments, if a fail status indicating an error is returned at step 811, corrective measures are taken at step 813 to deal with the alert of an error status. The defect can be treated at the word line, block, or die level. These can include marking the word line, block or die as bad and alternately, or additionally, taking steps to recover data. When the test is performed as part of the initial series of tests prior to shipping to a customer, the device may just be treated as defective. If a device is already in use, rather permanently mapping out a block when an error status is returned, the corresponding block can be added to a "grey block" list of blocks that are not marked as bad, but considered to be potentially bad and set aside for possible later use. For example, if a fast to program word line is detected, then control circuit can later use the block with some offset to programming voltages or other operating parameter levels as required. Other options include partial block usage, where good word lines are used and bad word lines skipped, using the block to store data in a binary format rather than a multi-state format.

Figure 9B:
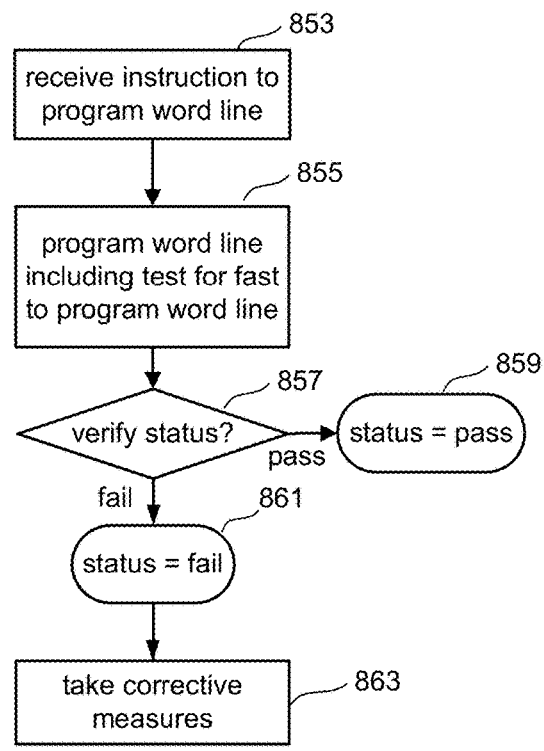
FIG. 9B is a flowchart describing one embodiment for programming that incorporates a check to determine whether a word line is programming too fast.

FIG. 9B is a flowchart describing one embodiment for incorporation of a test process for determining a fast to write word line into a data programming operation. At step 853 the memory device receives an instruction to program a word line. The word line is programmed at step 855, where the program operation includes a test to determine whether the program is fast to program. The result of the test is verified at step 857 to determine if the word lines too fast: if the test is passed, at step 859 a pass status is returned; if the test fails, a fail status is returned at step 861. As discussed below with respect to FIGS. 11-13, although the focus here is on the alert of an error status due to a word line programming too fast, a fail status can also be returned due to a word line programming too slowly.

In one set of embodiments, the test operation of step 855 can be based on applying a number voltages pulses to the word line and determining whether the number of memory cells exceeds a limit. This approach is discussed further below with respect to FIG. 11.

In another set of embodiments, the test operation of step 855 can be based on determining whether the number of voltage pulses needed to complete programming is too few. These embodiments are discussed further below with respect to FIGS. 12 and 13.

For either sets of embodiments, if a fail is returned at step 861, corrective measures are taken at step 863 to deal with the error status, with a fail resulting from a fast to program word line programming being treated similarly to a fail resulting from a word line that is too slow to program. The defect can be treated at the word line level, block level, die level or the level of some other portion of the die, and be treated similarly to word line considered defective for being too slow to program. These can include marking the word line, block, die or other portion of the memory device as bad; redirecting the data to be written in another word line; and alternately, or additionally, taking steps to recover data. The corresponding block can be added to a "grey block" list of blocks that are not marked as bad, but considered to be potentially bad and set aside for possible later use. For example, if a fast to program word line is detected, then control circuit can later use the block with some offset to programming voltages or other operating parameter levels as required. Other options include partial block usage, where good word lines are used and bad word lines skipped.

Alternately, or additionally, countermeasures can also be used at the system level to recover data and/or reprogram the data from the bad word line if backup data is available or can be extracted. For example, if the defective word line is being written from another location on the memory device, such as in folding operation where data is written in multi-state format from a binary cache on the same device, the source data may still be available in the binary cache. The data may also still be available in the data latches of the read/write circuits. In other cases, the data can be recovered through redundancy data.

Figure 10A:
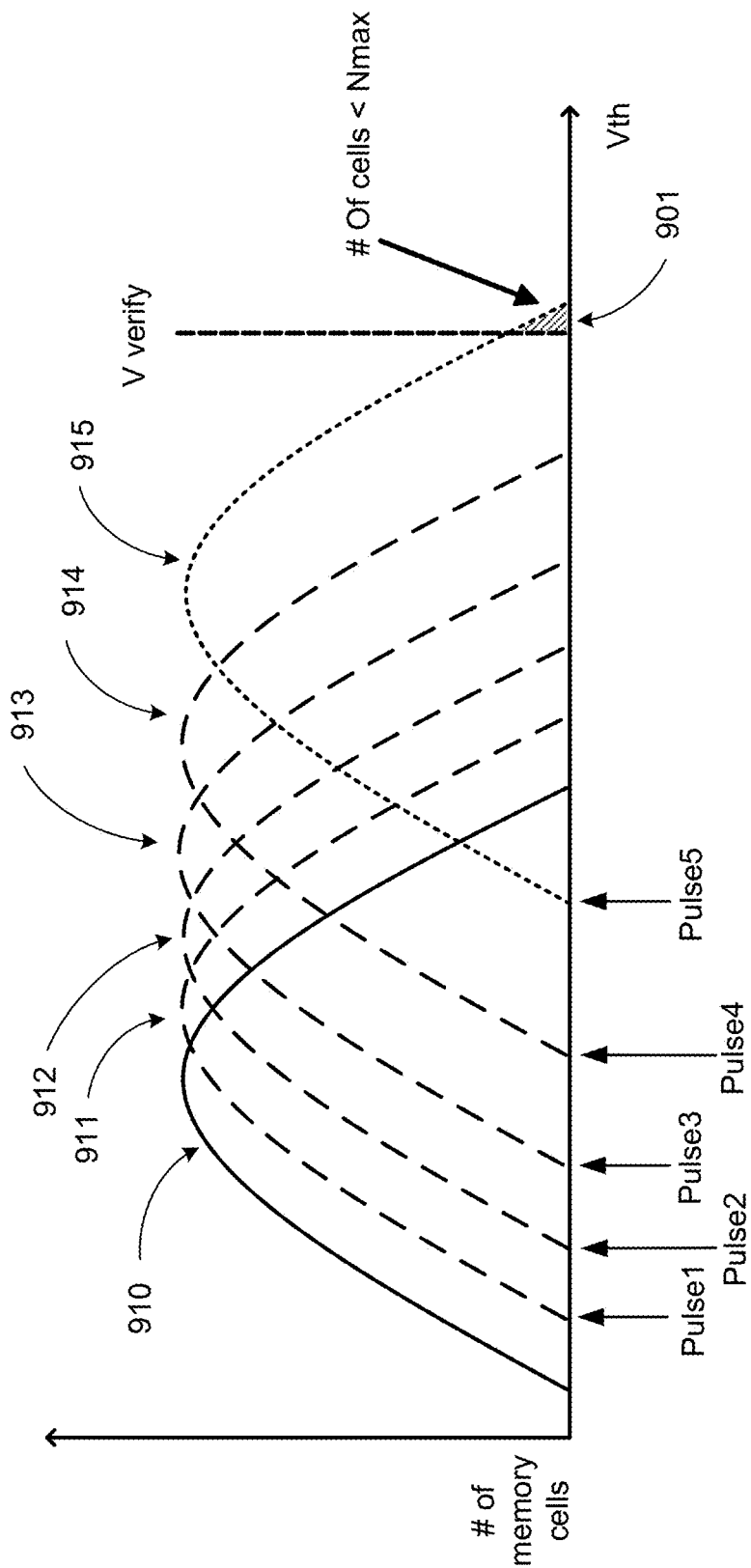
FIGS. 10A and 10B respectively illustrate the progression of a distribution of memory cells subjected to a sequence of voltage pulses for typical word line and for an overly fast to program word line.
Figure 10B:
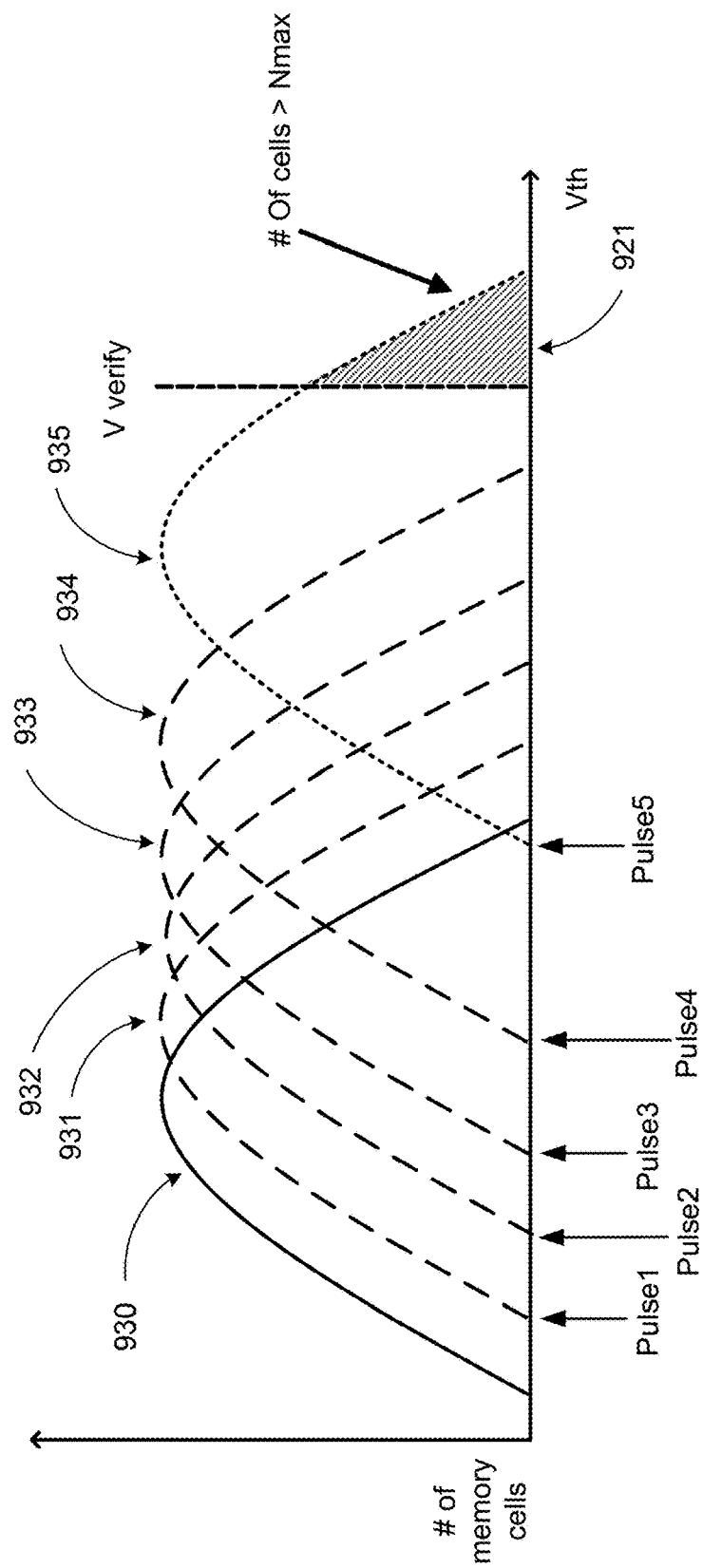

Considering the first set of embodiments, a set of memory cells connected to a word line are programmed by applying a series of voltage pulses to the word line, where all of the memory cells of the set receive all of the series of voltage pulses without being locked-out or inhibited. The set of memory cells can be all of the memory cells on the word line, or some sub-set of these. The set of memory cells is then verified to determine the number of cells above a reference level. FIGS. 10A and 10B respectively illustrate the situation for a word line that programs at the normal rate (FIG. 10A) and a word line that programs overly fast (FIG. 10B).

FIG. 10A illustrates the progression of a distribution of memory cells subjected to a sequence of voltage pulses. In FIG. 10A, the vertical axis is the number of memory cell and horizontal axis the threshold voltage of these memory cells. The distribution 910 is the distribution of memory cells in an erased state. The distribution 911, 912, 913, 914, and 915 respectively represent the distribution of the same memory cells after 1, 2, 3, 4, and 5 voltage pulses. As shown, with each voltage pulse, the distribution moves towards higher threshold voltages. After applying the voltage pulses, the memory cells are then read in a verify operations to determine the number of memory cell that exceed the reference value of Vverify. (Although the figure shows five voltage pulses, this is just one example and other numbers can be used.) The edge of the distribution 915 that extends beyond the reference value of Vverify is show in the hatched area 901. The number of memory cell in this region 901 is within a limit value of Nmax, reflecting that there is no, or at least a manageable amount of, over programming. The limit value Nmax can be based the system's error correction code capabilities, so that the number of over programmed memory cells along the word line is below the allowed number of bad bits. For example, Nmax can be the maximum number of allowed bad bits less some margin to accommodate other sources of error.

FIG. 10B is similar to FIG. 10A, but for the case when a word line is overly fast to program, leading to over programming. The erased state distribution is shown at 930, with the distribution after 1, 2, 3, 4, and 5 voltage pulses respectively shown at 931, 932, 933, 934, and 935. Relative to FIG. 10A, the upper tail of the distribution of 935 has a much larger number of memory cells in the region 921 whose threshold voltages exceed the Vverify reference level, exceeding the Nmax value. In this case, the word line is programming too rapidly and the number of over programmed memory cell is likely to be greater than the number of bad bits per word line that the ECC capabilities of the system can correct. For example, as discussed further below, in a smart verify scheme where this would correspond to a first verify for a data state i, a number of the memory cell may already be programmed beyond the read level for the next highest data state i+1, so that these memory cell would read as the wrong data state.

A similar process can also be incorporated into a smart program algorithm. During programming, for each of the target states, program verify skips each state after the S1 state for some number of voltage pulses. For example, referring back to FIG. 7D, state S2 verifies are skipped for the first 2 verifies, state S3 is skipped for the first 4 verifies, and so on. By counting the number of states beyond a threshold value at the first verify for a state, the memory device can determine the actual number of over programmed memory cell. If the number of bits that have programmed is higher than the limit, an error status is returned. This can be done for each state as it is progressively added to the states being verified, or a sub-set of the states.

For example, looking at the S3 state in the embodiment of FIG. 7D, S3 verifies are skipped for the first four loops and then, after the fifth program pulse the S3 state is verified. This is the situation illustrated in FIGS. 10A and 10B, where Vverify can be the standard verify level for the S3 state or another level, such as the verify level for the S4 state or a specific verify level introduced for this purpose. If the number of memory cell above this verify level exceed the limit (Nmax in FIGS. 10A and 10B), programming can be terminated and a fail status can be output for the program operation.

Figure 11:
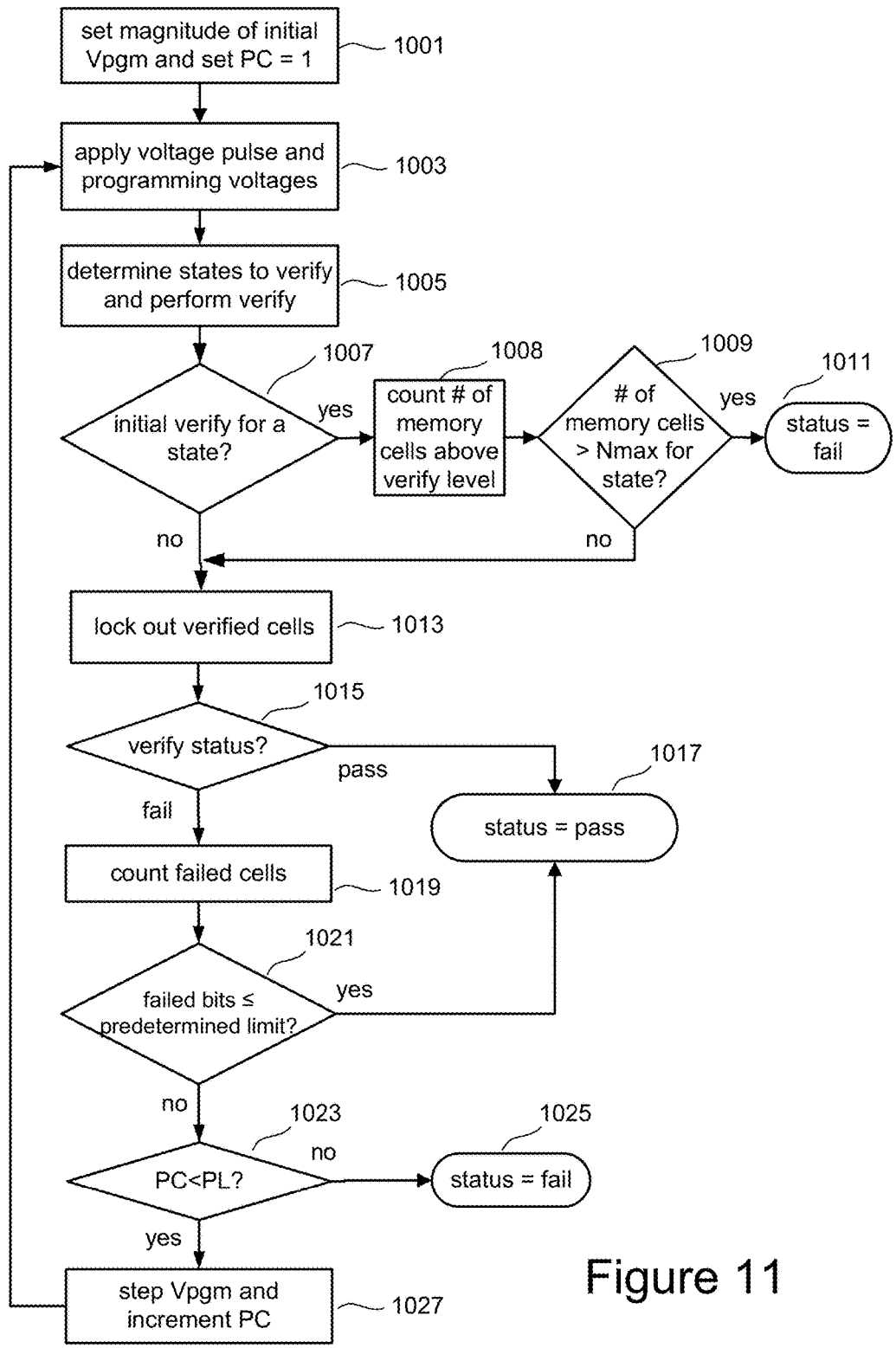
FIG. 11 is a flowchart describing one embodiment of a process for programming that incorporates a check to determine whether a word line is programming too fast.

FIG. 11 is a flowchart describing one embodiment of a process for programming a word line that incorporates a test to determine whether the word line is programming too fast, providing more detail for the steps 857, 859, and 861 of FIG. 9B. In particular, when using smart verify, on the initial inclusion of a data state in verify operation the number of memory cell exceeding the verify level is checked to see whether their number is within the maximum number allowed, as illustrated in FIG. 10A, or exceeds that maximum number allowed, as illustrated in FIG. 10B. FIG. 11 adds in this test for each of the data states as they are added into the states being verified, but in other embodiments only a sub-set of the data states can be checked.

The process of FIG. 11 is similar to the process of FIG. 7B, but as an alternative that incorporates a test for overly fast to program word lines. Beginning at step 1001, the programming voltage (Vpgm) is initialized to the starting magnitude (e.g., ~12-16V or another suitable level) and a program counter PC maintained by state machine 112 is initialized at 1. The starting magnitude can be a default value or, to account of the tapering of the memory holes, increased by some amount based on the word line group to which the selected word line belongs. In step 1003, a voltage pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 1003, the voltage pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

At step 1005, the sets of states to be verified in the smart verify operation is determined and the verify operations performed. As discussed above with respect to FIG. 7D, the data states are progressively added and removed for the verify set as the program loop count increases. At step 1007, if a data state is newly added to set being verified, part of the verification is to check on the number of memory cells that exceed a test verify level, where this test verify level can correspond to the newly added level's verification state or be another verify level used for the purpose. For instance, refereeing to FIG. 7D the state S3 is first verified after the 5th voltage pulse and would correspond to the situation of FIGS. 10A and 10B. In FIGS. 10A and 10B, the V verify level used to check for over programming could be the standard S3 verify level (Vv3 of FIG. 5) or another level, such as standard S4 verify level, depending on the embodiment. In other embodiment, a test verify level introduced for this purpose can be used, where this can be determined as part of the device characterization process performed on new devices to establish their operating parameters. The number of memory cell over the verify level is counted at step 1008 and then checked at step 1009 to see if it exceeds the maximum number Nmax allowed for that state. This counting and determination can be done by the memory device's state machine, the system's controller, or other logic. Depending on the embodiment, the number Nmax can depend upon the data state since, as memory cells will lock out along the way, when higher data states are introduced the number of memory cells still being programmed will typically decrease. The embodiment of FIG. 11 performs this test for each data state as it is introduced to the set being verified, but in other embodiments just a subset can be checked.

If at step 1009 the number of memory cells programmed past Vverify exceeds Nmax, then the memory cells connected to the selected word line are programming too fast (i.e. the situation is as in FIG. 10B); therefore, a fail status is returned at step 1011 and the programming operation is terminated. Step 1011 corresponds to step 861 of FIG. 9B and in response to the error status at step 1011, corrective measures can be taken as described above with respect to step 863 of FIG. 9B. If at step 1009 the number of memory cells programmed past Vverify is less than Nmax, the flow returns to step 1013 and rejoins the "no" path from 1007. At step 1013, memory cells that verify at their target state are then locked out from further programming in subsequent loops.

The flow in the embodiment of FIG. 11 can then continue through steps 1015-1027 similarly to those described above with respect to steps 776-786 in FIG. 7B. In step 1015, it is determined whether all the memory cells have reached their target threshold voltages (pass). If so, the programming process is complete and successful because all selected memory cells were programmed and verified to their target states. A status of "PASS" is reported in step 1017. If, at step 1015, it is determined that not all of the memory cells have reached their target threshold voltages (fail), then the programming process continues to step 1019 with the system counting the number of memory cells that have not yet reached their respective target threshold voltage distribution.

In step 1021, it is determined whether the count from step 1019 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 1017. In this situation, enough memory cells programmed correctly such that the few remaining memory cells that have not been completely programmed can be corrected using ECC during the read process.

If number of failed memory cells is not less than the predetermined limit, than the programming process continues at step 1023 and the program counter PC is checked against the program limit value (PL). If the program counter PC is not less than the program limit value PL, then the program process is considered to have failed and a status of FAIL is reported in step 1025. An error status at step 1025 can be treated similarly to an error status at step 1011. If the program counter PC is less than the program limit value PL, then the process continues at step 1027 during which time the Program Counter PC is incremented by 1 and the program voltage Vpgm is stepped up to the next magnitude. Depending on the embodiment, the step up in the Vpgm can be the same for all word lines or depend upon the word line group, such as discussed above with respect to FIG. 4D, where word lines groups nearer the top of the 3D structure may use larger step sizes to compensate for the effects of memory hole tapering. After step 1027, the process loops back to step 1003 and another voltage pulse is applied to the selected word line so that another iteration of the programming process of FIG. 11 is performed.

In another set of embodiments, word line that is programming too fast can be detected by determining how many program loops are required to complete programing a word line and, if the program loop count is too low, returning a fail status. It is common in programming algorithms to determine if a word line is defective due to being too slow to program, and consequently needing too many program loops, as at step 784 of FIG. 7B or step 1023 of FIG. 11. The following embodiments consider if a word line programs in too few program loops, either on a data state by data state basis or for a full complete programming operation to complete for all of the data states. The test based on program loop count can be performed as a test operation, either as part of the tests performed on a new device or as a built in self-test (BIST) operation performed be the state machine once the device is shipped and in use, or incorporated into a program algorithm as executed by the device's state machine.

In a one set of embodiments based on loop count, a mode is introduced based on the program loop count at which the entire programming operation for all data states completes. In addition to having a device parameter to control the maximum number of program loops (PLmax), a parameter is also introduced to control the minimum number of program loops (PLmin). In some embodiments, the assumption that all word lines take a similar number of loops can be used to determine the number of programming loops a typical programming operation uses. For example, if a 3-bit per memory cell embodiment regularly takes 22 loops for regular programming, a lower program loop limit PLmin could be set several loops lower at, for example, 18 loops, where these values can be determined as part of the device characterization process. When any word line completes programing in less than the minimum loop count value PLmin, an error status is returned.

Figure 12:
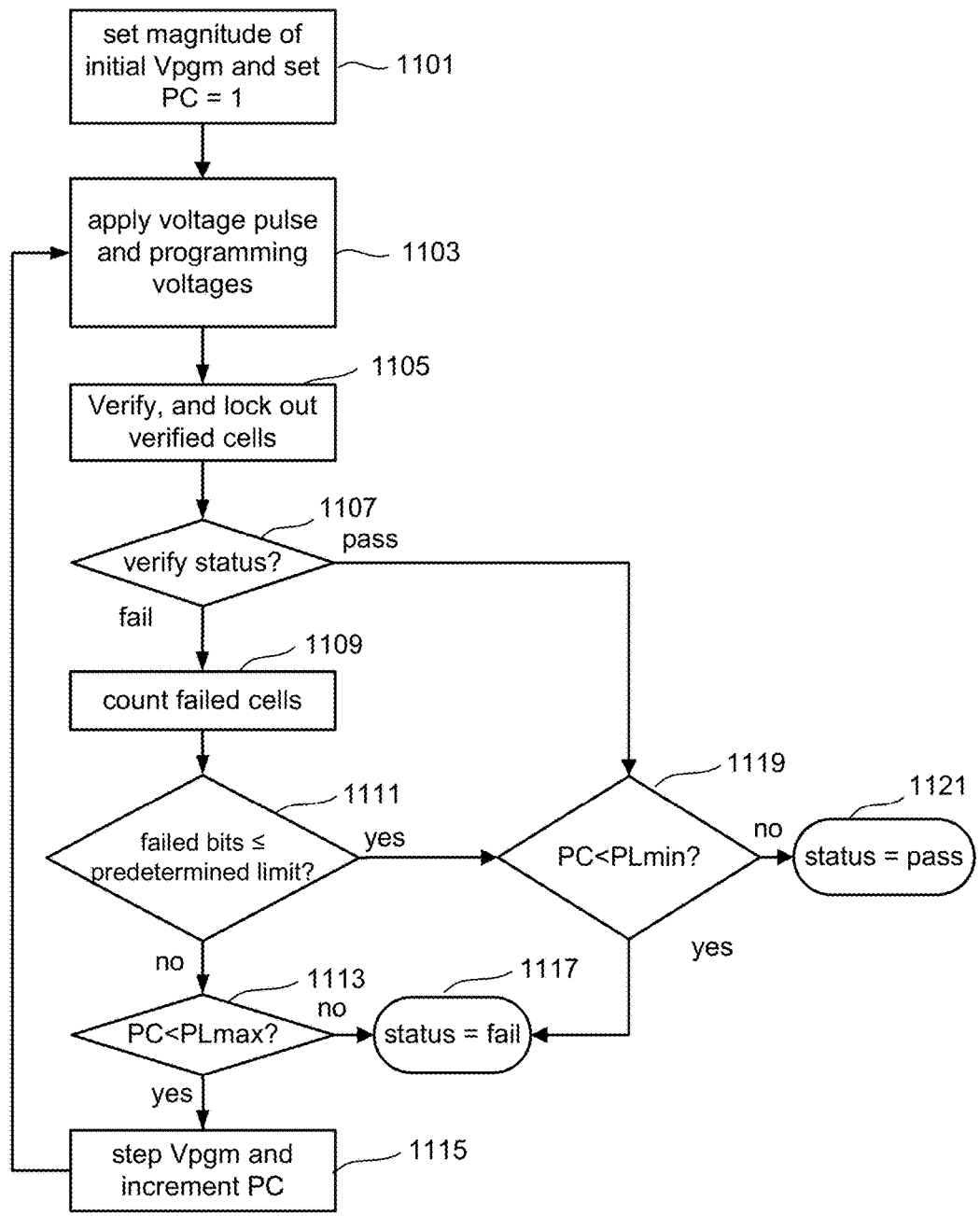
FIG. 12 is a flowchart describing one embodiment of a process for programming that incorporates a check to determine whether a word line is programming too fast based on a minimum loop count.

FIG. 12 is a flowchart describing one embodiment of a process for programming that incorporates a test to determine whether a word line is programming too fast based on a minimum loop count, providing more detail for steps 857, 859, and 861 of FIG. 9B. Considering FIG. 12 generally, the flow of FIG. 12 is a programming process that includes, aside from steps 1117, 1119 and 1121, a flow similar to those of the flow in FIG. 7B. FIG. 12 includes both a maximum number of program loops PLmax at step 1113, similar to step 784 of FIG. 7B, and also a minimum number of program loops PLmin at step 1119.

In more detail, at step 1101 the programming voltage (Vpgm) is initialized to the starting magnitude (e.g., ~12-16V or another suitable level that include an offset to account for word line group) and a program counter PC maintained by state machine 112 is initialized at 1. In step 1103, a voltage pulse of the programming waveform Vpgm is applied to the selected word line (the word line selected for programming). In step 1105, the appropriate memory cells are verified using the appropriate set of verify reference voltages to perform one or more verify operations, where a smart verify operation can be used to improve performance.

In step 1107, it is determined whether all the memory cells have reached their target threshold voltages (pass). If so, the programming process is complete and successful because all selected memory cells were programmed and verified to their target states and the flow goes to step 1119. If, in 1107, it is determined that not all of the memory cells have reached their target threshold voltages (fail), then the programming process continues to step 1109. In step 1109, the system counts the number of memory cells that have not yet reached their respective target threshold voltage distribution. In step 1111, it is determined whether the count from step 1109 is less than or equal to a predetermined limit. If the number of failed memory cells is less than or equal to the predetermined limit, the flow goes to step 1119. If number of failed memory cells is not less than the predetermined limit, than the programming process continues at step 1113 and the program counter PC is checked against the maximum program loop value (PLmax). If the program counter PC is not less than the maximum program loop value PLmax, then the program process is considered to have failed and an error status of FAIL is reported in step 1117. Step 1117 corresponds to step 861 of FIG. 9B. This is one example of a program fault due to a slow to program word line. If the program counter PC is less than the maximum program loop value PLmax, then the process continues at step 1115 during which time the Program Counter PC is incremented by 1 and the program voltage Vpgm is stepped up to the next magnitude, where the size of step can be dependent on the word line group of the selected memory cell.

More detail on the steps of FIG. 12 is given above with respect to the corresponding steps of FIG. 7B. In FIG. 7B, however, in response to either a "pass" result at step 776 or a "yes" result at step 782, the flow goes to step 778 to return a pass status for the program operation. Instead, FIG. 12 introduces a minimum program loop count to determine whether a word line programs in too few loops. In response to either a "pass" result at step 1107 or a "yes" result at step 1111, the flow goes to step 1119 to determine whether the program loop count PC is below the minimum program loop count PLmin. If not, a "pass" status is returned at step 1121. If instead the program operation completed in less the PLmin value, a "fail" status is returned at 1117, indicating a program failure.

In another set of embodiments based on program loop count, parameters can be introduced by which the memory system considers the loop count for each state after its completion. For each program loop count when a data state completes programming, the loop count can be checked against a lower limit program loop count for the state. Depending on the embodiment, the minimum program loop count for each data state can be a parameter defined by the total loop count, or defined relative to other parameters. For example, each the minimum loop count for a data state can be defined in terms of the number of program loops after that data state is first added to the smart verify routine. Referring back to the embodiment described with respect to FIG. 7D, the state S3 is skipped for the first 4 verifies, so that a fail status is returned if the state S3 completes programming within, for example, 2 additional voltage pulses.

More generally, if the NPC_x is the number of loops for state x to compete programming, and if PCV_x is the number of loops skipped before a data state x is included for verification, for each data state (or a selected set of states) the memory system can use the quantity (NPC_x−PCV_x) to determine a fast to program word line. If this difference is some number smaller than typical "Zx" for the state, (NPC_x−PCV_x)<Zx, an error status is returned. The number Zx can be determined as part of the device characterization process and should be large enough for a typical word line (i.e., not overly fast to program) to complete writing with a margin of one or two pulse, but small enough to catch a word line so fast that an unacceptable number of memory cells would be programmed into the next higher data state. For example, the comparison can be done by the memory device's state machine either as part of a BIST mode or as part of a data program operation. Once an error status is returned for any of the data states, the programming operation can be aborted and the word line treated as defective. As discussed further below, depending on the embodiment, the word line, corresponding block or even die can then be marked as defective, with remedial actions taken.

Figure 13:
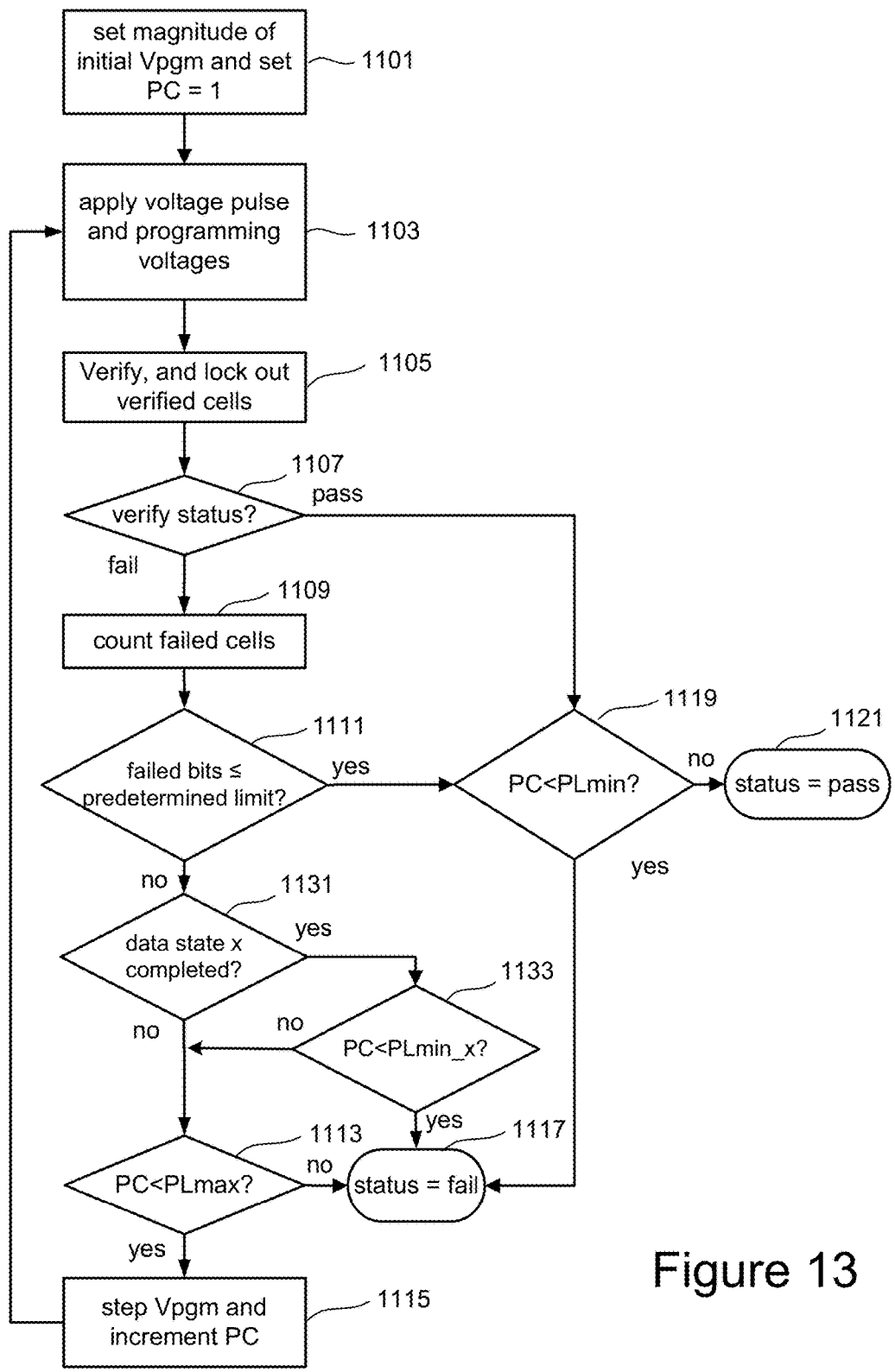
FIG. 13 is a flowchart describing one embodiment of a process for programming that incorporates a check to determine on a data state by data state basis whether a word line is programming too fast based on loop count.

FIG. 13 is a flowchart describing one embodiment of a process for programming that incorporates a check to determine on a data state by data state basis whether a word line is programming too fast based on loop count. FIG. 13 repeats the elements of FIG. 12, where the corresponding steps are similarly numbered, but now also introduces a minimum loop count for each state at steps 1131 and 1133.

In FIG. 13, rather than the "no" path from step 1111 going straight to step 1113, it first goes to step 1131. At step 1131, it is determined whether the memory cells being programmed to a data state x have completed programming. Depending on the embodiment, this may be all of the memory cells whose target state is x or there may an allowance for some number that fail to verify. If no states have completed at step 1131, the flow continues on to step 1113. If, instead, a data state x has completed programing at step 1131, the loop count PC is checked against the minimum loop count for that data state x of PLmin_x at step 1133. If the data state x completed in fewer loops than this value, a fail status is returned at 1117 and the program operation is aborted. Corrective measures can then be taken as described above with respect to step 863 of FIG. 9B. If the loop count is not below the lower limit PLmin_x, the flow continues on to step 1113. If, as discussed above, the minimum loop count PLmin_x is based on an offset Zx relative to the number PCV_x of loops skipped before data state x is included for verification, PLmin_x can be expressed as PLmin_x=(PCV_x+Zx). As the PLmin value used at step 1119 is for when all data have completed programing, PLmin can be the same as PLmin_x for x being the highest data state or can be a different value, depending on the embodiment.

Figure 14:
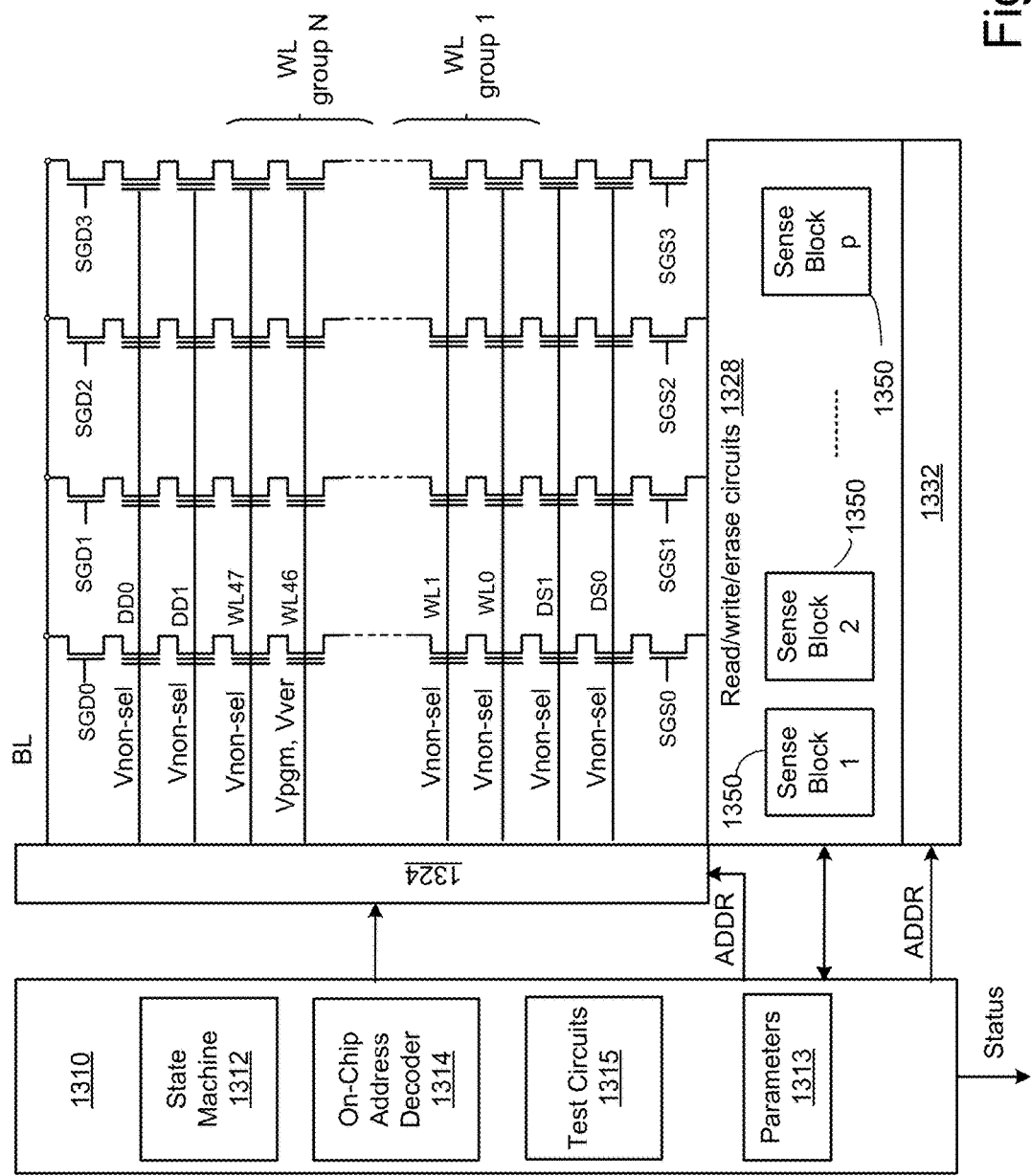
FIG. 14 illustrates some of the elements of a memory circuit that are relevant to the techniques described with respect to FIGS. 11-13.

FIG. 14 repeats in a simplified form a number of the elements of FIGS. 1-4G that are relevant to the discussion of determining word lines that are too fast to program and that could lead to an uncorrectable amount of error. The memory cells are represented by a set of 4 NAND strings, one for each of the fingers, each of which is connected between the bit line BL and the read/write circuits 1328 and the sense blocks 1350 including Sense Block 1, Sense Block 2, . . . , Sense Block p. The memory structure is addressable by word lines via a row decoder 1324 and by bit lines via a column decoder 1332. The drivers to bias the word lines can also be included in the row decoder 1324 and column decoder 1332. In a program operation, the drivers bias the word lines by applying both the programing voltages Vpgm and verify voltages Vver to the selected word line (WL46 in this example) and the appropriate non-selected word line voltages Vnon-sel to the other word lines.

The programing operation and determination of word line whose memory cells too fast to program can be controlled by one or more control circuits including the controller (122, FIG. 1), the on-chip control circuitry (110, FIG. 1), or some combination of these and be implemented through hardware, firmware, software, or some combination of these. FIG. 14 shows an embodiment where the determination of the fast to program word lines is controlled by an on-chip control circuit 1310, including the state machine 1312, address decoder 1314 and test circuits 1315, to perform embodiments such as described above with respect to FIGS. 9A, 9B, and 11-13. Although the state machine 1312, address decoder 1314 and test circuits 1315 are represented here as separate blocks, these elements often use the same or overlapping circuit elements in many embodiments. The on-chip control circuit 1310 can also maintain the parameters 1313 in volatile or non-volatile to be used by the state machine 1312 to determine the fast to program word lines. In some of the embodiments described above, these parameters can include Nmax at step 1009 of FIG. 11, PLmin at 1119 of FIGS. 12 and 13, and PLmin_x at step 1133 of FIG. 13. An alert due to an error status from a fast to program word line is output by the on-chip control circuit 1310 as represented by the Status output. For example, an error status would be sent out from the on-chip control circuit 1310 to the memory system's controller (122, FIGS. 1 and 2), where it would serve as an alert to mark the word line (or block or die) as defective and for possible remedial action.

Any of the embodiments presented here can help to avoid uncorrectable ECC failures due to word line over programming caused by improper trimming of program voltages that lead to overly fast to program word lines. These techniques can be used both as a test operation and by incorporation into a data program operation. Although discussed separately, the different approaches are complementary with different relative advantages and can be used in combination. The method described with respect to FIG. 11 is more directly relevant to the actual over programming phenomenon as the first verified voltage pulse is programming too many bits. Additionally, the method of FIG. 11 can have more granularity as compared to the methods of FIGS. 12 and 13. The approach of FIG. 12 can be more sensitive to activity of each state and not just the highest data state. The approach of FIG. 13 can be effective in the field as the control circuit's firmware can monitor the program loop numbers on the fly. The minimum program loop numbers can be maintained in look up tables, for example. As the programing speed of a memory device can vary as it ages, typically programming faster they age, a look up table for the parameters can also take this into account. For example, the PLmin values can decrease as the program/erase count of a block increases.

In one embodiment, an apparatus includes a word line, a plurality of memory cells connected along a word line, a programming circuit, a sensing circuit, and a test circuit. The programming circuit is connected to the plurality of memory cells and the programming circuit configured to apply a series of voltage pulses to the word line during a programming operation. The sensing circuit is connected to the plurality of memory cells and is configured to perform a first verify operation for a first data state after a voltage pulse of the series of voltage pulses. The test circuit configured to determine a number of memory cells that satisfy the first verify operation and that are programmed above a reference level and is configured to signal an alert in response to the number of memory cells targeted for the first data state that are programmed above the reference level exceeding a threshold.

In some embodiments, an apparatus includes a plurality of non-volatile memory cells connected to a common word line, a program/verify circuit, and a control circuit connected. The program/verify circuit is connected to the plurality of non-volatile memory cells and is configured to perform a programming operation by applying a plurality of voltage pulses to the common word line. The control circuit is connected to the program/verify circuit and is configured to determine a number of voltage pulses required to complete the programming operation. The control circuit is configured to determine an error status in response to determining that the number of voltage pulses required to complete the programming operation is less than a threshold.

In other embodiments, an apparatus includes a word line unit, the word line unit comprising a word line and plurality of non-volatile memory cells connected to the word line, means for programming the non-volatile memory cells, and means for determining whether the word line unit is defective. The means for programming the non-volatile memory cells apply a plurality of voltage pulses to the word line and performing one or more verify operations on the non-volatile memory cells. The means for determining determine, based on the one or more verify operations, whether the word line unit is defective due to the word line unit programming faster than a baseline performance level.

In example implementations, the memory cells of a word line unit are formed as NAND strings in a monolithic three-dimensional memory structure as described above with respect to FIGS. 3 and 4A-4G, where a plurality of dielectric layers, a plurality of memory columns and plurality of isolation areas, the word line layers are arranged alternatingly with the plurality of dielectric layers forming a stack, the memory columns extend vertically through at least a portion of the stack.

The means for programming the memory cells can include the read/write/erase circuits and decoding circuits such as illustrated in elements 124, 128, and 132 of FIGS. 1 and 1324, 1328, and 1332 of FIG. 14, including the Sense Blocks 150 of FIG. 1 and 1350 of FIG. 14. These elements can variously include voltage supplies, voltage regulators and charge pumps as well the decoding circuitry for applying these levels to bias the memory array.

The means for determining whether the word line is defective due to the word line being too fast to program can include the on-chip control circuitry (110 for FIG. 1, 1310 of FIG. 14), including a state machine (112 FIG. 1, 1312 FIG. 14), system controller 122 (FIGS. 1 and 2), or some combination of these, and implement the control function through firmware, hardware, software, or some combination of these.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible considering the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a word line;
a plurality of memory cells connected to the word line;
a programming circuit connected to the plurality of memory cells, the programming circuit configured to apply a series of voltage pulses to the word line during a programming operation;
a sensing circuit connected to the plurality of memory cells, the sensing circuit configured to perform a first verify operation for a first data state after a voltage pulse of the series of voltage pulses; and
a test circuit configured to determine a number of memory cells that satisfy the first verify operation and that are programmed above a reference voltage level and configured to signal an alert in response to the number of memory cells targeted for the first data state that are programmed above the reference voltage level exceeding a threshold number.

2. The apparatus of claim 1, wherein the programming operation is part of a test operation.

3. The apparatus of claim 1, wherein the programming operation is part of a data programming operation to program memory cells connected to the word line from an erased state to one of a plurality of data states.

4. The apparatus of claim 3, wherein the reference voltage level corresponds to a program verify voltage level for one of the plurality of data states.

5. The apparatus of claim 4, wherein, after each voltage pulse of the series of voltage pulses subsequent to a first voltage pulse, the sensing circuit is configured to:
perform a verify operation for a subset of one or more of the data states,
wherein data states not previously part of the subset are progressively added to the subset subsequent to applying the voltage pulse of as the series of voltage pulses, and
wherein the first verify operation is a verify operation that first includes the first data state in the subset.

6. The apparatus of claim 3, wherein, in response to the alert, data being programmed to the word line in the programming operation is programmed to a different word line.

7. The apparatus of claim 1, wherein, in response to the alert the word line is marked as defective.

8. The apparatus of claim 1, wherein the word line belongs to a block of memory cells having a plurality of word lines and, wherein, in response to the alert the block of memory cells is marked as potentially defective.

9. An apparatus, comprising:
a plurality of non-volatile memory cells connected to a common word line;
a program/verify circuit connected to the plurality of non-volatile memory cells, the program/verify circuit configured to perform a programming operation by applying a plurality of voltage pulses to the common word line; and
a control circuit connected to the program/verify circuit, the control circuit configured to determine a number of voltage pulses required to complete the programming operation, the control circuit configured to determine an error status in response to determining that the number of voltage pulses required to complete the programming operation is less than a threshold number.

10. The apparatus of claim 9, wherein the programming operation is part of a built-in self-test operation.

11. The apparatus of claim 9, wherein the programming operation is part of a data programming operation to program the non-volatile memory cells from an erased state to one of a plurality of data states.

12. The apparatus of claim 11, wherein the number of voltage pulses required to complete the programming operation is the number of voltage pulses for the data programming operation to complete programing of all of the plurality of data states.

13. The apparatus of claim 11, wherein the plurality of non-volatile memory cells are selected to be programmed to a first data state of the plurality of data states and wherein the number of voltage pulses is the number of voltage pulses to complete programing of the plurality of non-volatile memory cells to the first data state.

14. The apparatus of claim 13, wherein the data programming operation comprises a smart verify algorithm wherein, after each voltage pulse of the data programming operation subsequent to a first voltage pulse, the program/verify circuit is configured to:
perform a verify operation for a subset of one or more of the data states, and
progressively add data states not previously part of the subset to the subset subsequent to applying of the voltage pulse of the data programming operation,
wherein the threshold number is an offset number relative to the number of voltage pulses after which the first data state is added to the data states that are verified between voltage pulses.

15. The apparatus of claim 11, wherein, in response to the error status, data being programmed to the common word line in the programming operation is re-directed to a different word line.

16. The apparatus of claim 9, wherein the threshold number is based on a number of times that the common word line has been erased.

17. The apparatus of claim 9, wherein, in response to the error status, a portion of the apparatus is marked as defective.

18. The apparatus of claim 9, wherein the common word line belongs to a block of non-volatile memory cells having a plurality of word lines and, wherein, in response to the error status the block of non-volatile memory cells is operated using different parameters.

19. The apparatus of claim 9, wherein the plurality of non-volatile memory cells is part of a monolithic three-dimensional semiconductor memory device where the non-volatile memory cells are arranged in multiple physical levels above a substrate and comprise a charge storage medium, and wherein the common word line runs horizontally above the substrate.

* * * * *